(12) United States Patent
Tonkikh et al.

(10) Patent No.: US 11,848,194 B2
(45) Date of Patent: Dec. 19, 2023

(54) LATERAL MICRO-LED

(71) Applicant: Meta Platforms Technologies, LLC, Menlo Park, CA (US)

(72) Inventors: Alexander Tonkikh, Cork (IE); Guillaume Lheureux, Cork (IE); Markus Broell, Cork (IE); Berthold Hahn, Cork (IE)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 233 days.

(21) Appl. No.: 17/319,936

(22) Filed: May 13, 2021

(65) Prior Publication Data
US 2022/0367751 A1    Nov. 17, 2022

(51) Int. Cl.
| | | |
|---|---|---|
| *H01L 33/30* | (2010.01) | |
| *H01L 33/00* | (2010.01) | |
| *H01L 33/38* | (2010.01) | |
| *H01L 33/06* | (2010.01) | |
| *H01L 33/08* | (2010.01) | |

(52) U.S. Cl.
CPC .......... *H01L 33/06* (2013.01); *H01L 33/0062* (2013.01); *H01L 33/08* (2013.01); *H01L 33/30* (2013.01); *H01L 33/38* (2013.01); *H01L 2933/0016* (2013.01)

(58) Field of Classification Search
CPC ..... H01L 33/38; H01L 33/30; H01L 33/0062; H01L 33/06; H01L 33/025; H01L 33/005; H01L 33/20; H01L 2933/0016
See application file for complete search history.

(56) References Cited

PUBLICATIONS

International Search Report and Written Opinion for International Application No. PCT/US2022/029204 dated Sep. 7, 2022, 11 pages.
Kim I., et al., "Diffusion-Driven Charge Transport in Light Emitting Devices," Materials, vol. 10, No. 12, Dec. 12, 2017, 17 pages.
Myllynen A., et al., "Diffusion-Driven GaInP/GaAs Light-Emitting Diodes Enhanced by Modulation Doping," Optical and Quantum Electronics, vol. 51, No. 3, Mar. 14, 2019, 8 pages.
Myllynen A., et al., "Electrically-Injected III-V Diodes for Large-Area Optoelectronics," 2018 International Conference on Numerical Simulation of Optoelectronic Devices (NUSOD), IEEE, Nov. 5, 2018, pp. 129-130.

*Primary Examiner* — Savitri Mulpuri
(74) *Attorney, Agent, or Firm* — Weaver Austin Villeneuve & Sampson LLP

(57) ABSTRACT

A lateral micro-light emitting diode includes a first semiconductor layer, an active region on the first semiconductor layer and including one or more quantum well layers configured to emit light, a p-type semiconductor region on a first lateral region (e.g., a central region) of the active region, and an n-type semiconductor region on a second lateral region (e.g., peripheral regions) of the active region, where the n-type semiconductor region and the p-type semiconductor region are on a same side of the active region.

14 Claims, 23 Drawing Sheets

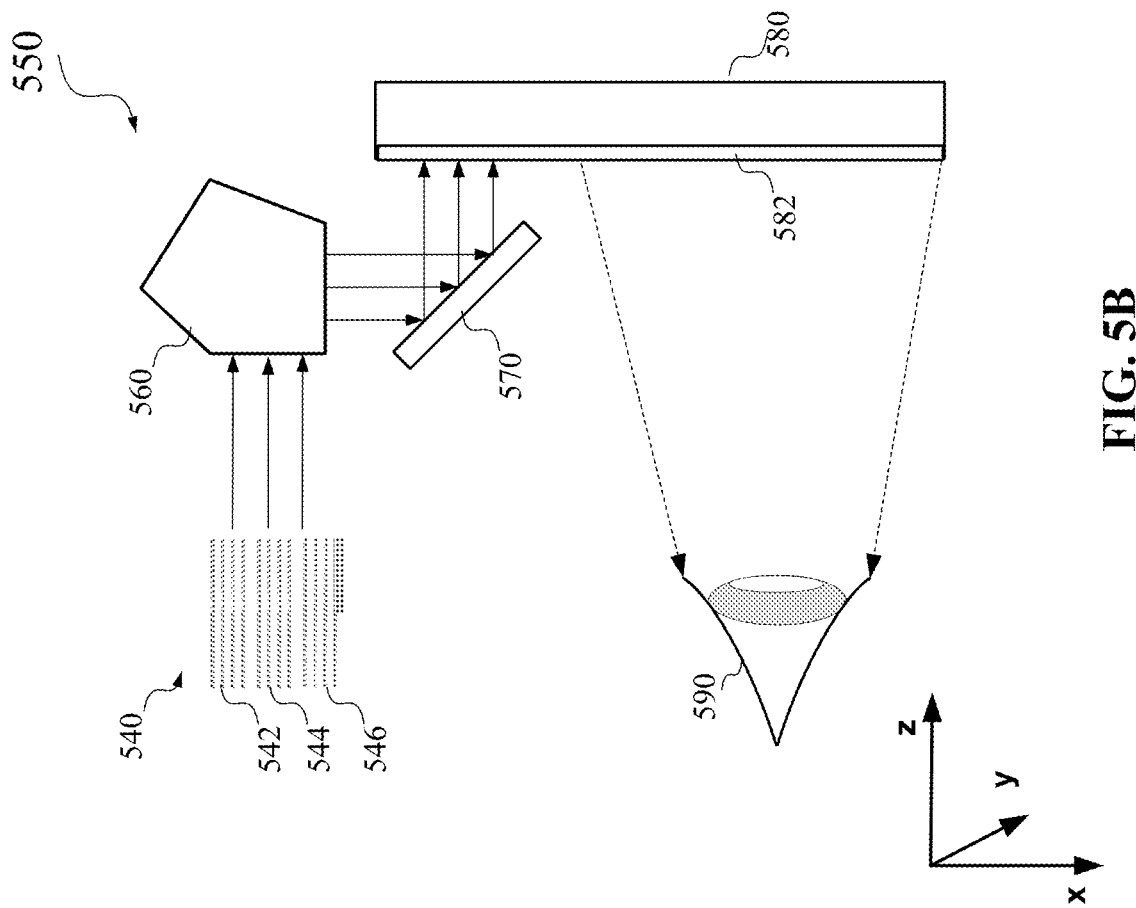
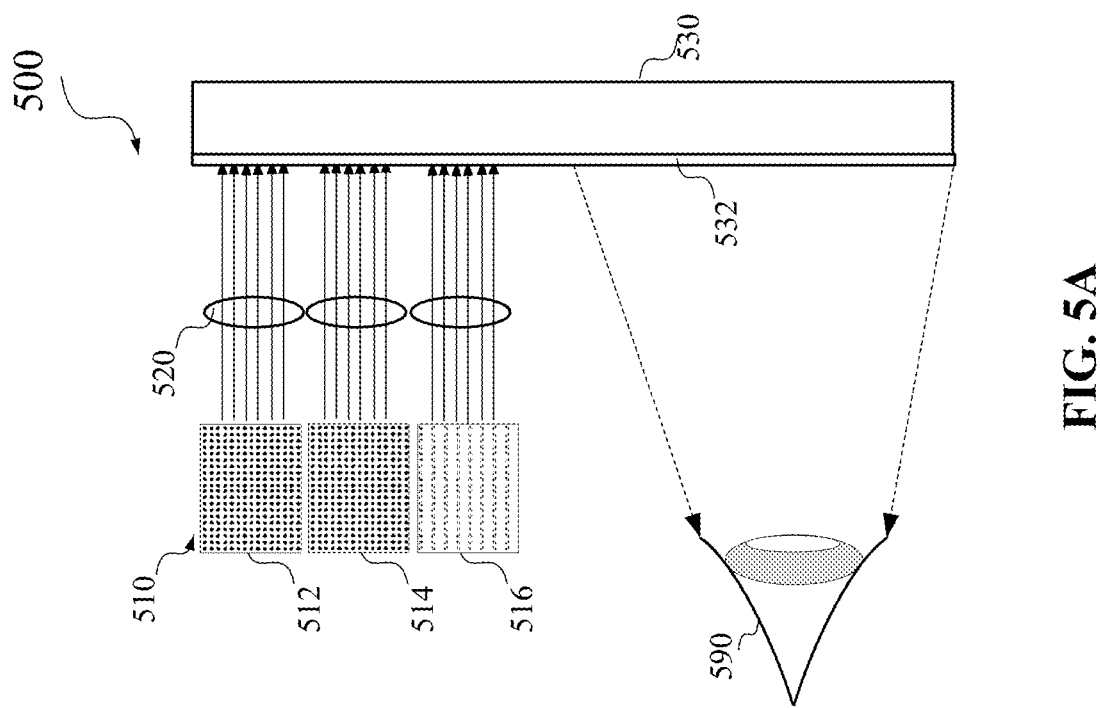
FIG. 5B
FIG. 5A

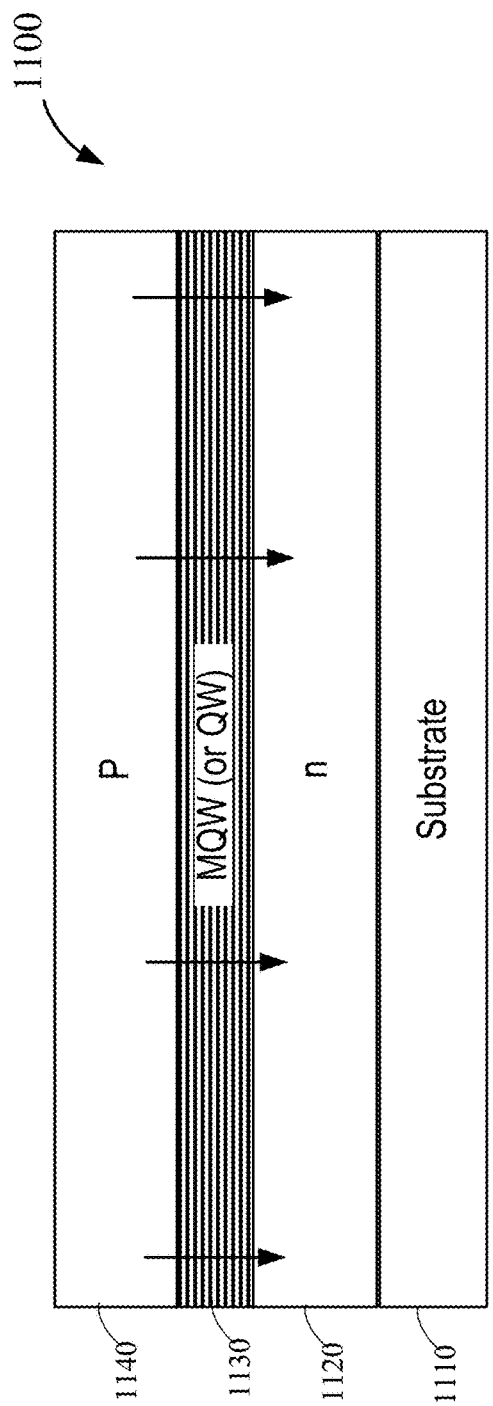
FIG. 11A
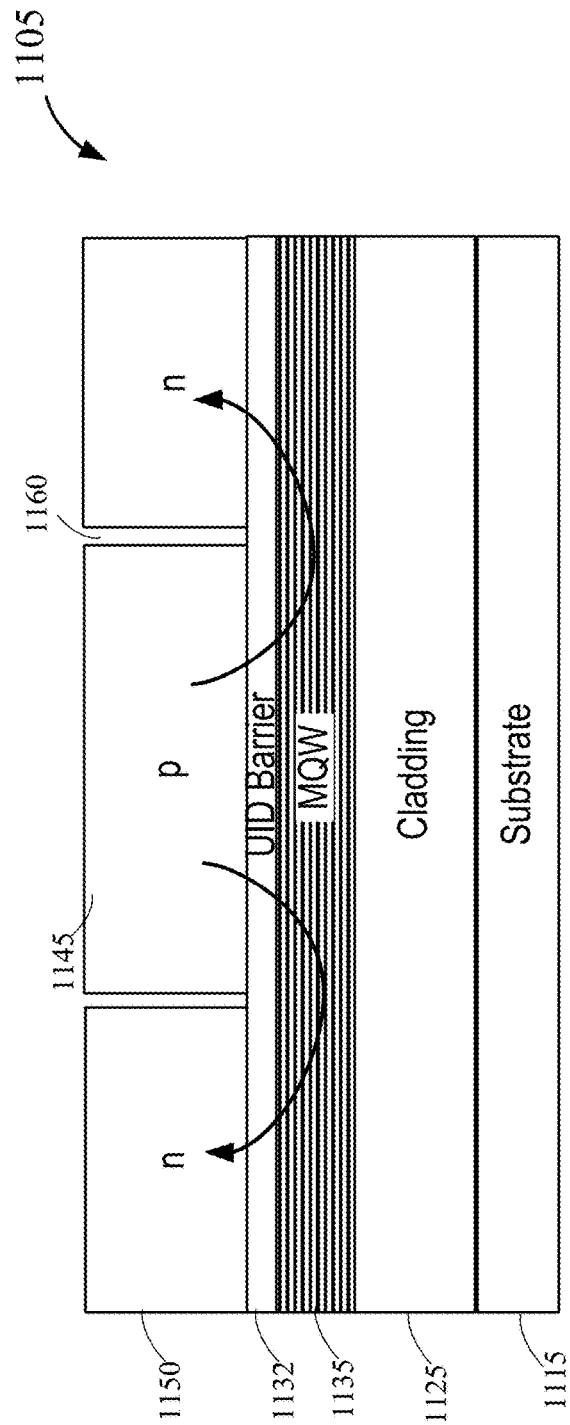
FIG. 11B
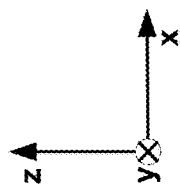

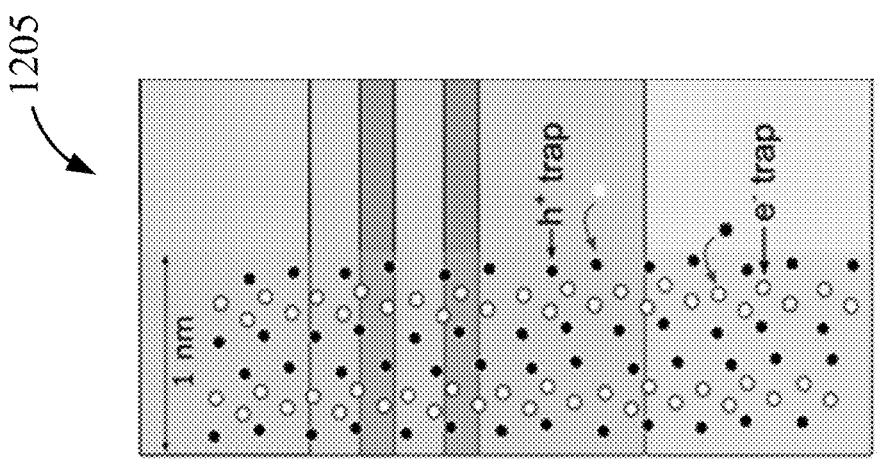
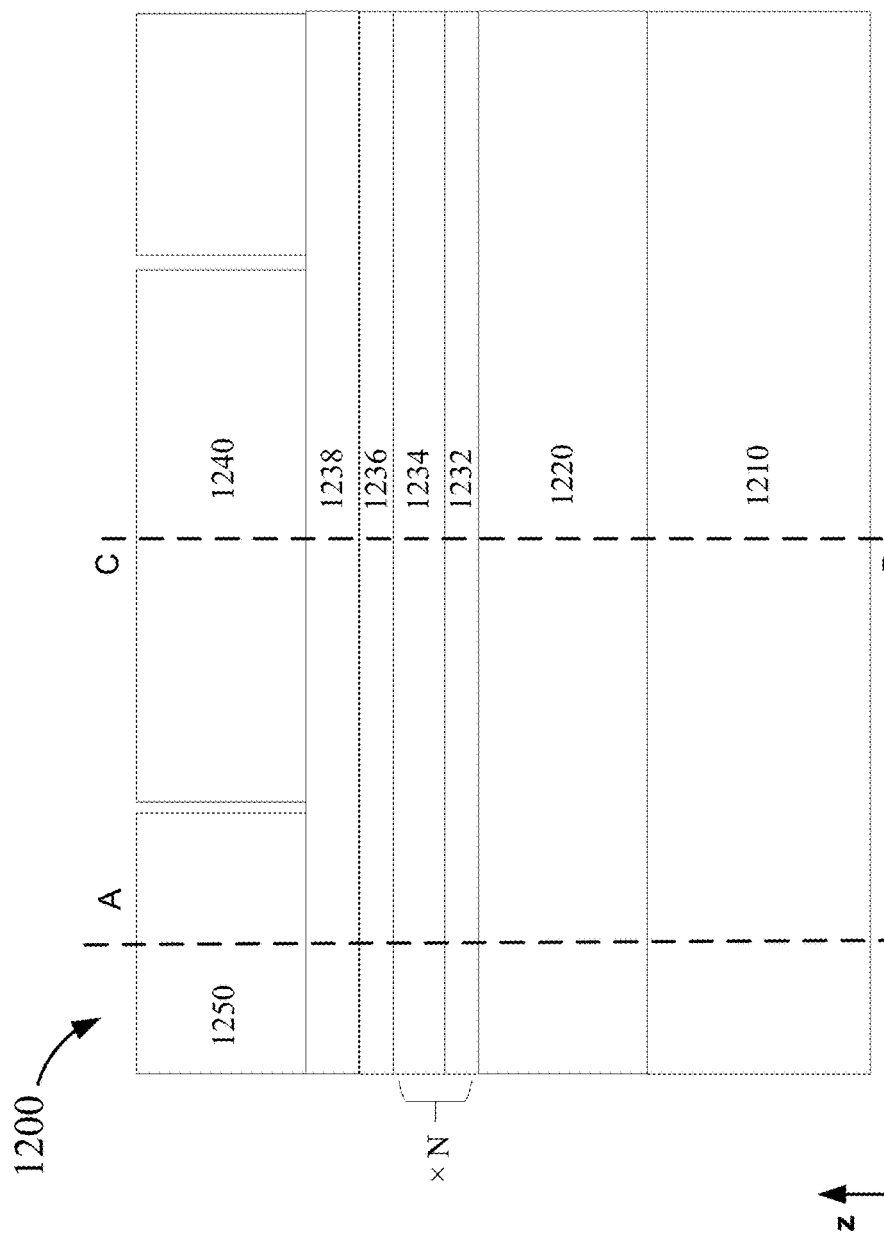
FIG. 12A
FIG. 12B

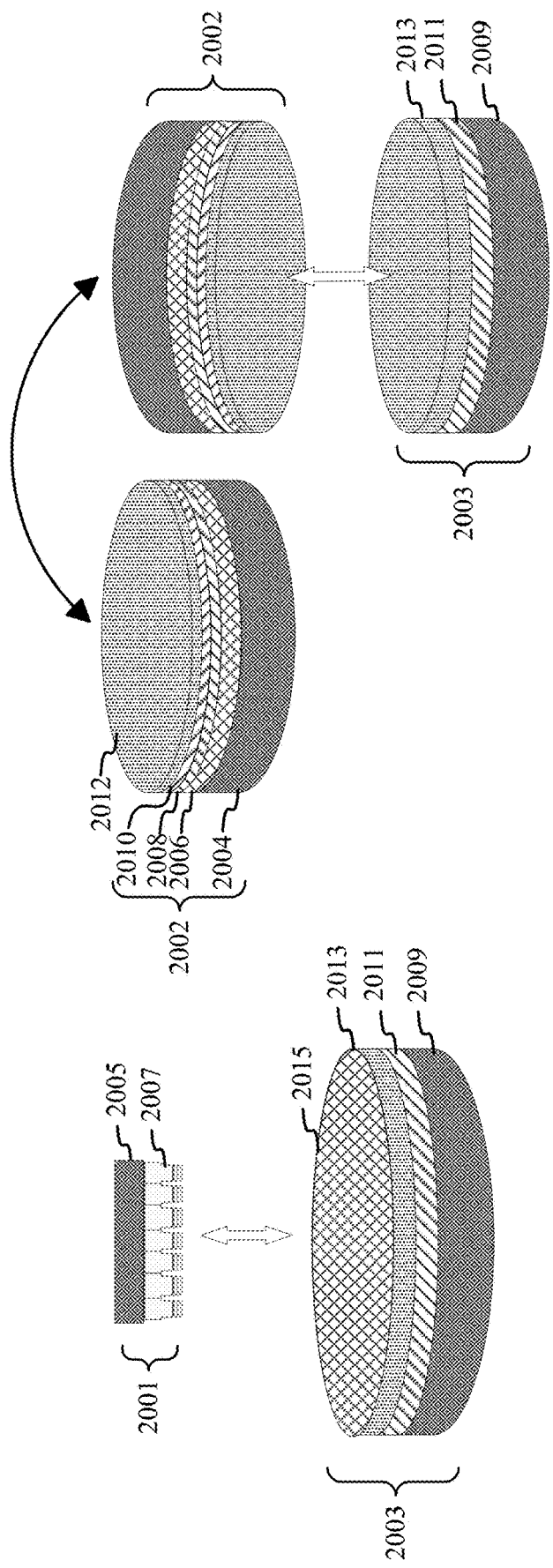

LATERAL MICRO-LED

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, InGaN, AlGaInP, other ternary and quaternary arsenide and phosphide alloys, and the like, have begun to be developed for various display applications due to their small size (e.g., with a linear dimension less than 100 nm, less than 50 nm, less than 10 nm, or less than 5 nm), high packing density (and hence higher resolution), and high brightness. For example, micro-LEDs that emit light of different colors (e.g., red, green, and blue) can be used to form the sub-pixels of a display system, such as a television or a near-eye display system. However, Micro-LEDs often suffer from low efficiencies, in particular, because of non-radiative losses at the sidewalls of the mesa structures of individual micro-LEDs.

SUMMARY

This disclosure relates generally to micro-light emitting diodes (micro-LEDs). More specifically, this disclosure relates to lateral micro-LEDs where injected carriers may move horizontally within the active region and radiatively recombine at or near the center of the active region, thereby reducing non-radiative recombination of carriers at mesa sidewalls and improving quantum efficiencies of the micro-LEDs. Various inventive embodiments are described herein, including devices, systems, methods, structures, materials, processes, and the like.

According to certain embodiments, a lateral micro-LED includes a first semiconductor layer, an active region on the first semiconductor layer and including one or more quantum well layers configured to emit light, a p-type semiconductor region on a first lateral region of the active region, and an n-type semiconductor region on a second lateral region of the active region, where the n-type semiconductor region and the p-type semiconductor region are on a same side of the active region.

In some aspects, a lateral size of the active region is less than about 10 µm. In some aspects, the p-type semiconductor region is on a center region of the active region and is surrounded by the n-type semiconductor region. In some aspects, the lateral micro-LED includes an isolation region between the p-type semiconductor region and the n-type semiconductor region. In some aspects, the isolation region is characterized by a width less than about 250 nm.

In some aspects, the one or more quantum well layers are configured to emit red light. In some aspects, the one or more quantum well layers include InGaP layers, each of the InGaP layers characterized by a thickness less than about 10 nm. In some aspects, the first semiconductor layer includes a cladding layer that is undoped or lightly p-doped. In some aspects, the one or more quantum well layers include 4 or more quantum well layers. In some aspects, the active region includes a top barrier layer characterized by a thickness higher than other barrier layers in the active region, the top barrier layer is adjacent to the p-type semiconductor region and the n-type semiconductor region, and the top barrier layer is undoped or unintentional doped.

According to certain embodiments, a lateral micro-LED includes a substrate, a cladding layer on the substrate, an active region on the cladding layer and including one or more quantum well layers configured to emit light, a p-type semiconductor region on a first lateral region of the active region, an undoped or unintentionally doped semiconductor region on a second lateral region of the active region and adjacent the p-type semiconductor region, and an n-contact region formed in a peripheral region of the undoped or unintentionally doped semiconductor region, a peripheral region of the active region, or both.

In some aspects, a lateral size of the lateral micro-LED is less than about 10 µm. In some aspects, the p-type semiconductor region is on a center region of the active region and is surrounded by the undoped or unintentionally doped semiconductor region. In some aspects, the one or more quantum well layers include InGaP layers, each of the InGaP layers characterized by a thickness less than about 10 nm. In some aspects, the p-type semiconductor region and the undoped or unintentionally doped semiconductor region are formed in a same epitaxial layer, and the p-type semiconductor region includes a p-type dopant diffused in the epitaxial layer. In some aspects, the n-contact region includes a metal layer that alloys with the peripheral region of the undoped or unintentionally doped semiconductor region, the peripheral region of the active region, or both.

According to certain embodiments, a method of fabricating a lateral micro-LED includes growing a cladding layer on a substrate, growing an active region on the cladding layer, forming a p-type semiconductor region on a first lateral region of the active region, and forming an n-type semiconductor region on a second lateral region of the active region, where the active region includes one or more quantum well layers configured to emit light, and the n-type semiconductor region and the p-type semiconductor region are on a same side of the active region.

In some aspects, forming the p-type semiconductor region on the first lateral region of the active region includes growing a p-type semiconductor layer on the active region, and selectively etching the p-type semiconductor layer to remove the p-type semiconductor layer on the second lateral region of the active region. Forming the n-type semiconductor region on the second lateral region of the active region may include epitaxially growing an n-type semiconductor layer on the second lateral region of the active region.

In some aspects, forming the p-type semiconductor region and the n-type semiconductor region may include growing an n-type semiconductor layer on the active region, selectively doping the n-type semiconductor layer on the first lateral region of the active region with a p-type dopant to form the p-type semiconductor region, and etching, before or after the doping, the n-type semiconductor layer to separate the p-type semiconductor region and the n-type semiconductor region.

In some aspects, forming the p-type semiconductor region and the n-type semiconductor region may include growing an unintentionally doped semiconductor layer on the active region, selectively doping the unintentionally doped semiconductor layer on the first lateral region of the active region with a p-type dopant to form the p-type semiconductor region, forming a metal layer at a peripheral region of the unintentionally doped semiconductor layer, and annealing the metal layer to alloy the metal layer with the peripheral region of the unintentionally doped semiconductor layer to form the n-type semiconductor region.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIG. 11A illustrates an example of a micro-LED having a vertical p-i-n structure.

FIG. 11B illustrates an example of a lateral micro-LED according to certain embodiments.

FIG. 12A illustrates another example of a lateral micro-LED according to certain embodiments.

FIG. 12B illustrates an example of simulating Fermi level pinning and surface losses at the sidewalls of the example of the lateral micro-LED of FIG. 12A using different trap levels according to certain embodiments.

FIG. 20A illustrates an example of a method of die-to-wafer bonding for arrays of LEDs according to certain embodiments.

FIG. 20B illustrates an example of a method of wafer-to-wafer bonding for arrays of LEDs according to certain embodiments.

Figure 1:
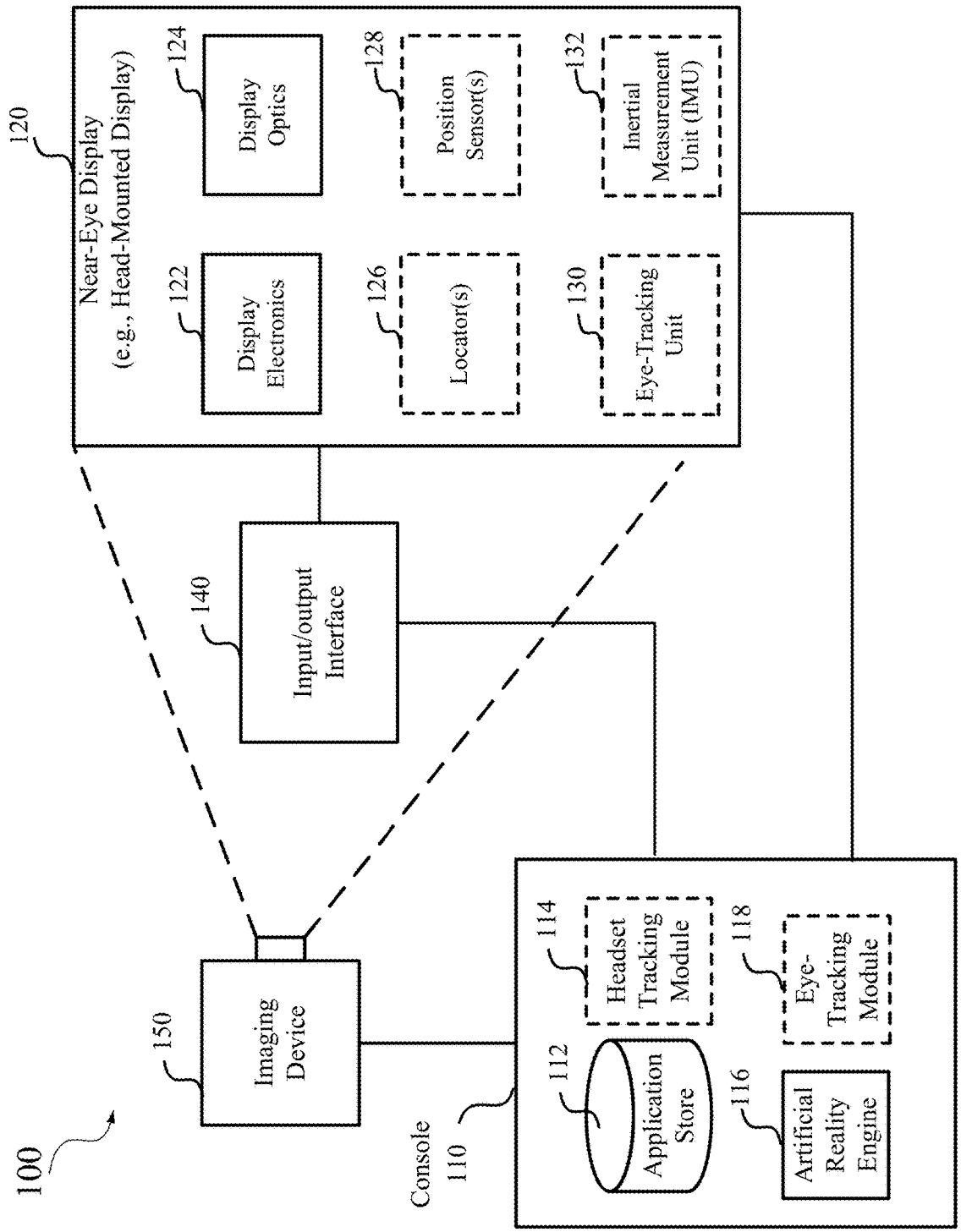
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, this disclosure relates to lateral micro-LEDs where injected carriers may mainly move horizontally within the active region and radiatively recombine at or near the center of the active region, thereby reducing non-radiative recombination of carriers at mesa sidewalls and improving quantum efficiencies of the micro-LEDs. Various inventive embodiments are described herein, including devices, systems, methods, structures, materials, processes, and the like.

Augmented reality (AR) and virtual reality (VR) applications may use near-eye displays that include tiny monochrome light emitters, such as mini- or micro-LEDs. In LEDs, photons are generated through the recombination of electrons and holes within an active region (e.g., one or more semiconductor layers that may form one or more quantum wells). The internal quantum efficiency (IQE) is the ratio between the number of photons emitted and the number of carriers (electrons and holes) injected in the active region. The generated light may be extracted from the LEDs in a particular direction or within a particular solid angle. The ratio between the number of emitted photons extracted from an LED and the number of electrons passing through the LED is referred to as the external quantum efficiency (EQE), which describes how efficiently the LED converts injected electrons into photons that are extracted from the LED. For some LEDs, in particular, micro-LEDs with reduced physical dimensions, the internal and external quantum efficiencies may be very low, and improving the quantum efficiency of the LEDs can be challenging.

The quantum efficiency of LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites and electron-electron-hole (eeh) and/or electron-hole-hole (ehh) Auger recombination. The Auger recombination is a non-radiative process involving three carriers, which affects all sizes of LEDs. In micro-LEDs, because the lateral size of each micro-LED may be comparable to the minority carrier diffusion length, a larger proportion of the total active region may be within a distance less than the minority carrier diffusion length from the LED sidewall surfaces where the defect density and the defect-induced non-radiative recombination rate may be high. Therefore, a larger proportion of the injected carriers may diffuse to the regions near the sidewall surfaces, where the carriers may be subjected to a higher SRH recombination rate due to a higher defect density. This may cause the efficiency of the LED to decrease (in particular, at low current injection), cause the peak efficiency of the LED to decrease, and/or cause the peak efficiency operating current to increase. Increasing the current injection may cause the efficiencies of the micro-LEDs to drop due to the higher eeh or ehh Auger recombination rate at a higher current density. As the physical size of LEDs is further reduced, efficiency losses due to surface recombination near the etched sidewall facets that include surface imperfections may become much more significant. AlGaInP material may have a higher surface recombination velocity and a longer minority carrier diffusion length. For example, carriers in the AlGaInP material can have high diffusivity (mobility), and the AlGaInP material may have an order of magnitude higher surface recombination velocity than III-nitride materials. Thus, the internal and external quantum efficiencies of AlGaInP red LEDs may drop even more significantly as the device size reduces.

According to certain embodiments, to reduce the no-radiative recombination at the mesa sidewalls and thus improve the internal quantum efficiency of micro-LEDs, the p-i-n structure of the micro-LEDs may have a non-vertical arrangement where the p-type semiconductor region and the n-type semiconductor region of the p-i-n structure may be at different lateral regions on a same side of the active region, rather than on two opposite sides of the active region as in vertical micro-LEDs. For example, the p-type semiconductor region (or the n-type semiconductor region) may be surrounded by the n-type semiconductor region (or the p-type semiconductor region) such that the injected current may flow laterally in the active region from regions under the p-type semiconductor region to regions under the n-type semiconductor region. Therefore, under a forward bias, carriers may be injected into the active region under the p-type semiconductor region and the active region under the n-type semiconductor region, and may mostly move laterally within the active region between the active region under the p-type semiconductor region and the active region under the n-type semiconductor region. During the lateral movement, the injected carriers (holes and electrons) may radiatively recombine at or near the center of the active region, before diffusing to sidewall regions of the active region to non-radiatively recombine at defect sites.

Because the mesa sidewalls are located away from the current injection pathways, fewer carriers may diffuse to the sidewall regions of the active region to non-radiatively recombine via the surface states at the defect sites. As such, the internal quantum efficiency of the lateral micro-LED may be improved due to the lower efficiency reduction caused by non-radiative recombination at the sidewall regions as the physical dimension of the micro-LED decreases. For example, the IQE of lateral micro-LEDs may be in the same order as the IQEs of macro-LEDs, and may be maintained as the physical dimension of the micro-LED decreases. Thus, the reduction of the physical dimension may have little or minimum impact on the IQE of lateral micro-LEDs. Therefore, lateral micro-LEDs architecture disclosed herein may be beneficial for small micro-LEDs, such as red light-emitting AlGaInP-based micro-LEDs that have linear dimensions less than about 10 μm (e.g., less than about 5 μm, 4 μm, or 3 μm), which may otherwise have significant efficiency reduction as the physical dimension reduces due to losses caused by non-radiative recombination at the sidewall regions.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "LED array precursor" refers to an LED die or wafer that does not have the opposing electrical contacts and/or the associated driver circuitry for each LED such that a driving voltage or current may be applied to the LED for the LED to emit light. For example, an LED array precursor may be a wafer or die with an epitaxial layer stack that may or may not include the light emitting regions, a wafer or die with mesa structures formed in the epitaxial layer stack, a wafer or die with LED arrays and metal contacts formed thereon but without the driver circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display

120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
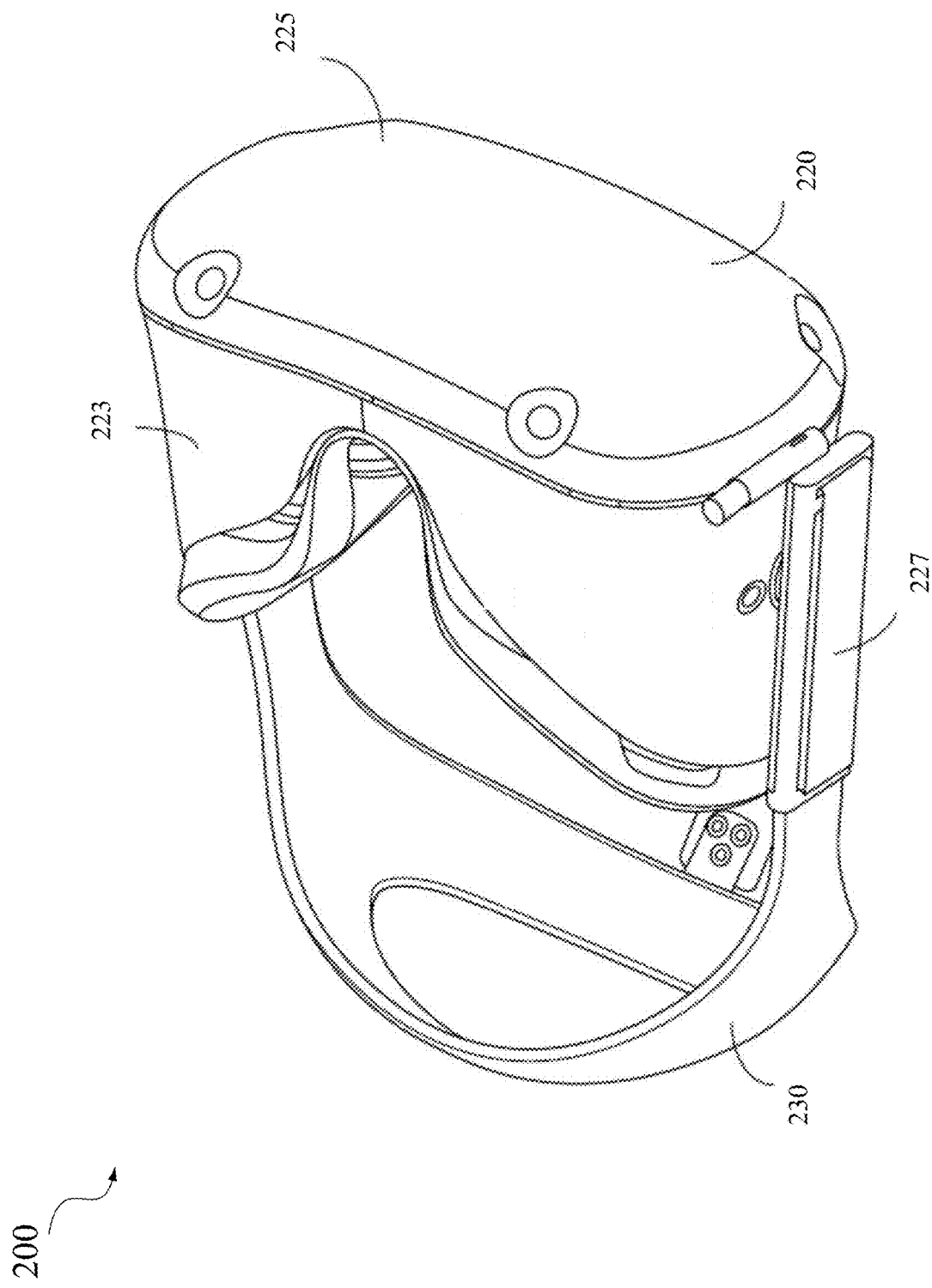
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
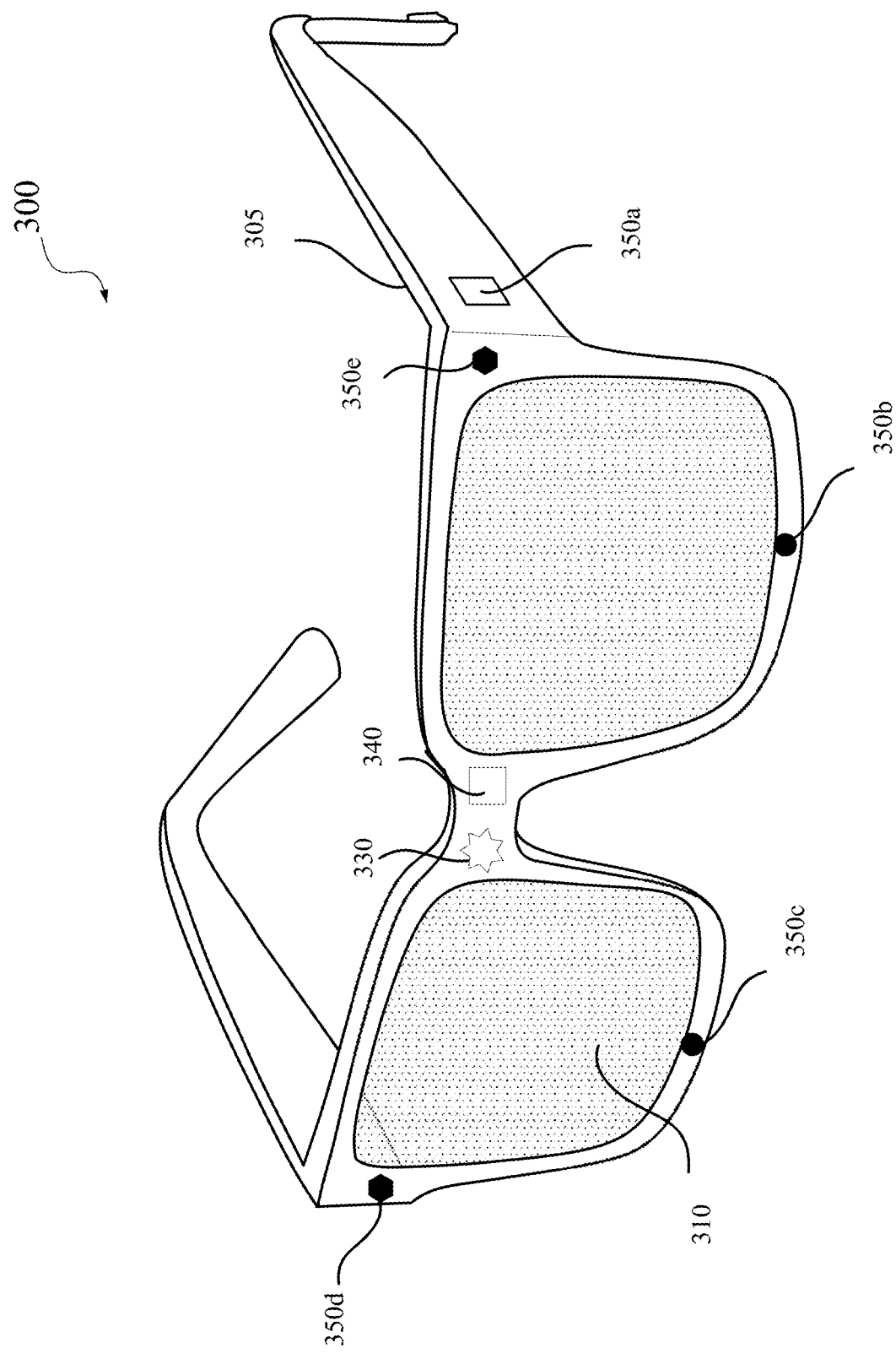
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
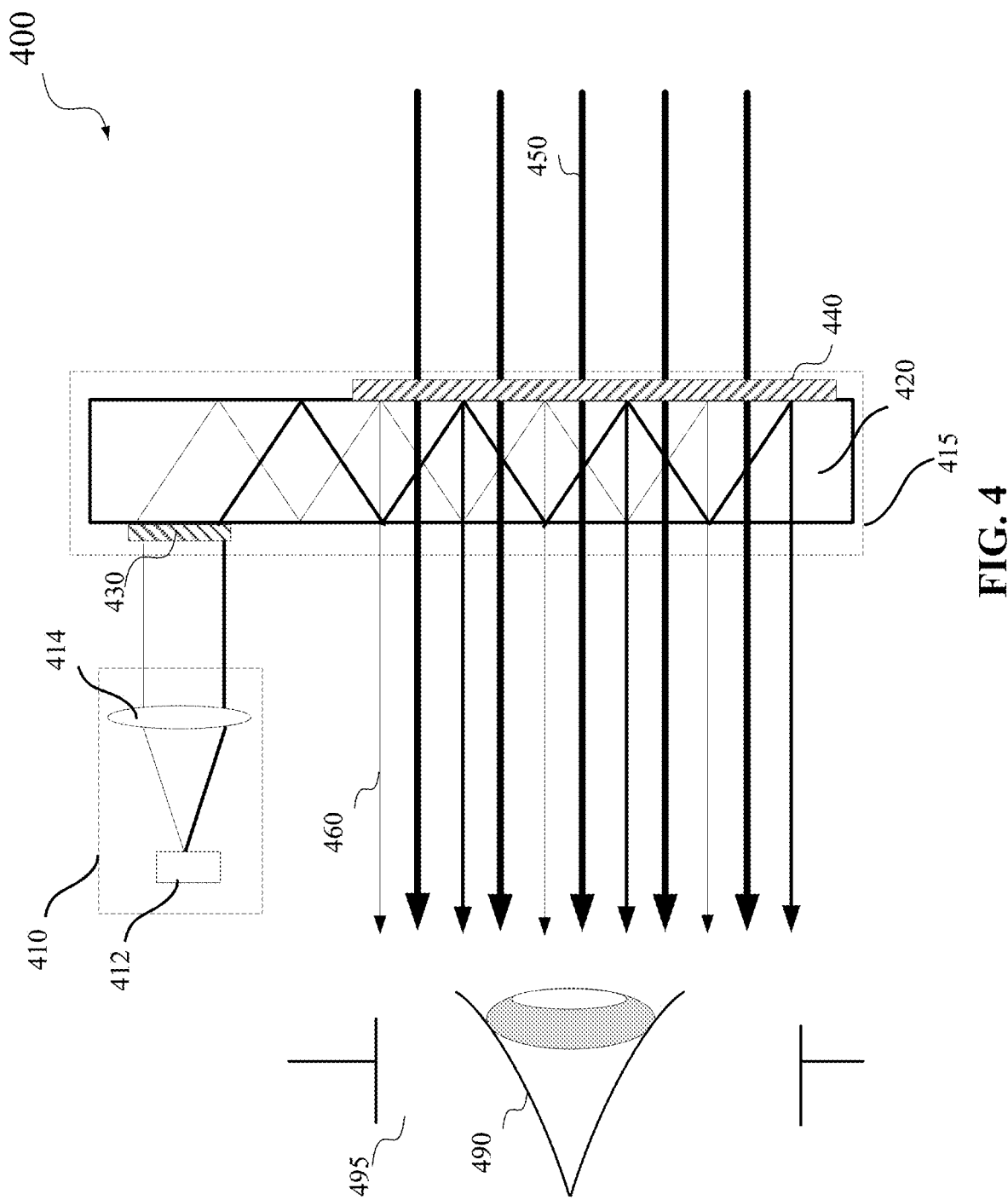
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415.

Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
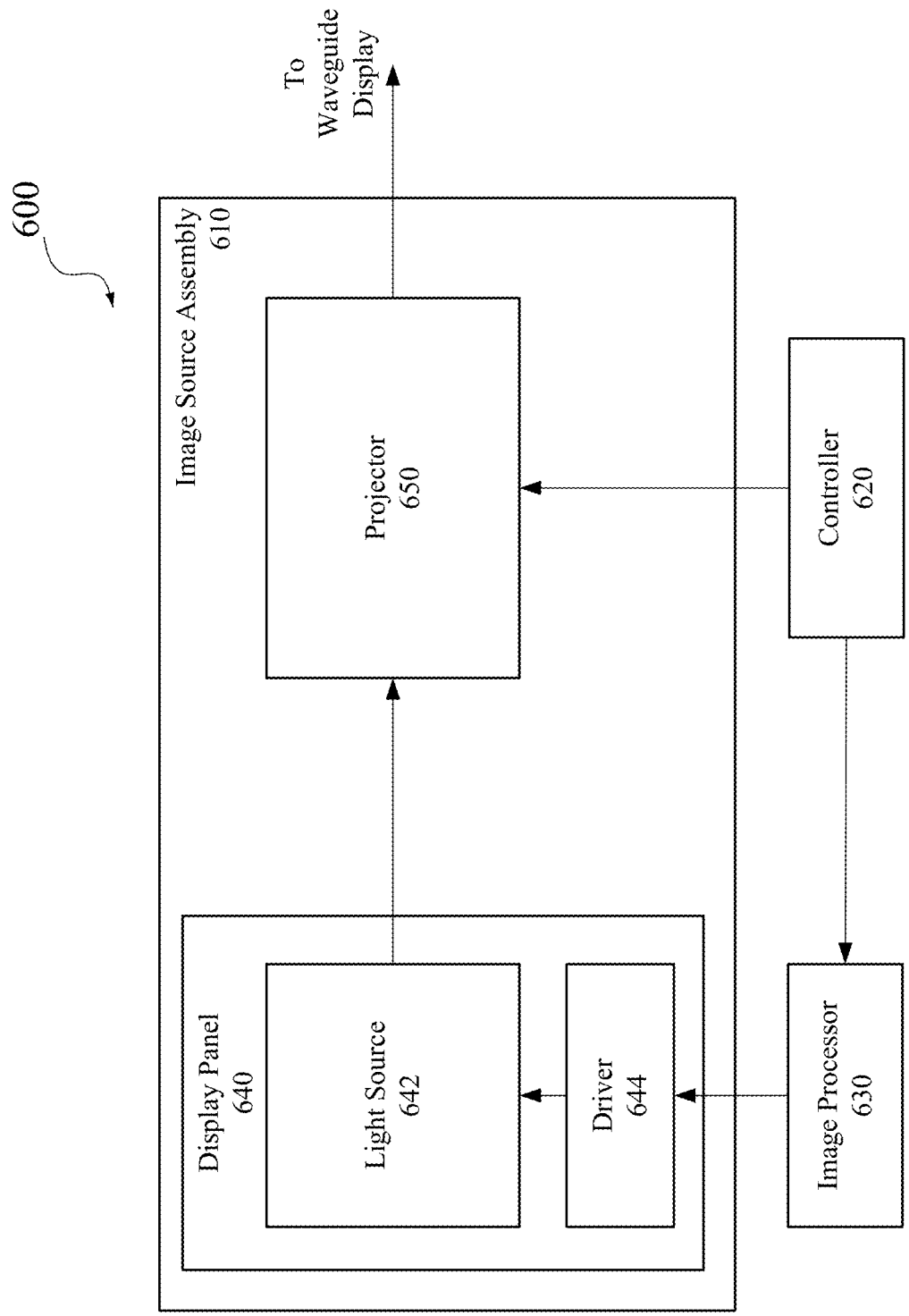
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \quad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation.

Photons can be generated in a semiconductor LED (e.g., a micro-LED) at a certain internal quantum efficiency through the recombination of electrons and holes within the active layer (e.g., including one or more semiconductor layers). The generated light may then be extracted from the LEDs in a particular direction or within a particular solid angle. The ratio between the number of emitted photons extracted from the LED and the number of electrons passing through the LED is referred to as the external quantum efficiency, which describes how efficiently the LED converts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency can be challenging. In some embodiments, to increase the light extraction efficiency, a mesa that includes at least some of the layers of semiconductor materials may be formed.

Figure 7A:
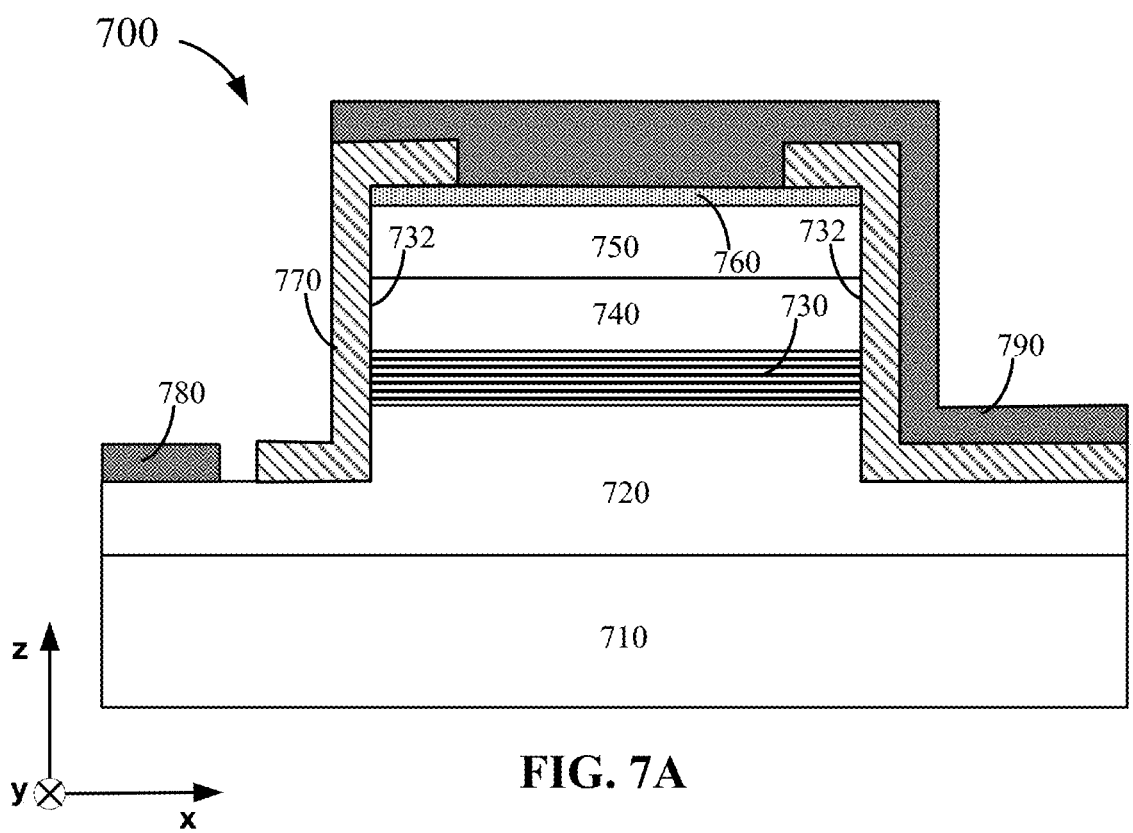
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlGaInP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlGaInP situated between a layer of p-type AlGaInP doped with zinc or magnesium and a layer of n-type AlGaInP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlGaInP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
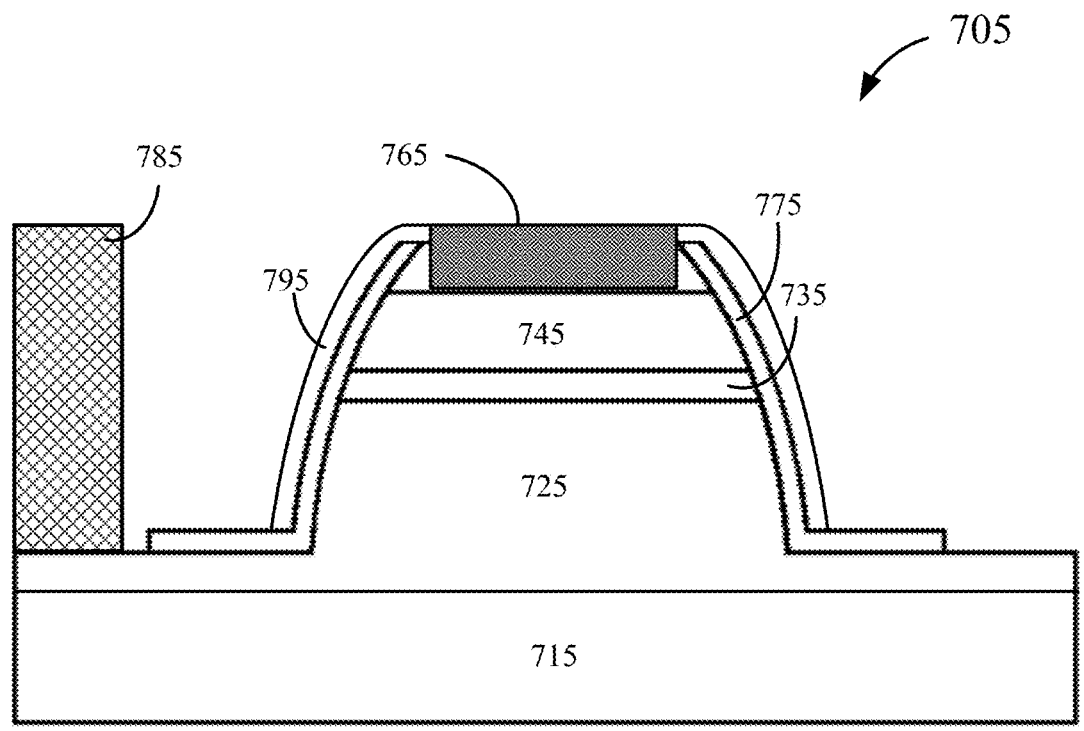
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlGaInP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlGaInP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

When the mesa structure is formed (e.g., etched), the facets of the mesa structure, such as mesa sidewalls 732, may include some imperfections, such as unsatisfied bonds, chemical contamination, and structural damages (e.g., when dry-etched), that may decrease the internal quantum efficiency of the LED. For example, at the facets, the atomic lattice structure of the semiconductor layers may come to an abrupt end, where some atoms of the semiconductor materials may lack neighbors to which bonds may be attached. This results in "dangling bonds," which may be characterized by unpaired valence electrons. These dangling bonds create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively.

As described above, the internal quantum efficiency is the proportion of the radiative electron-hole recombination in the active region that emits photons. The internal quantum efficiency of LEDs depends on the relative rates of competitive radiative (light producing) recombination and non-radiative (lossy) recombination that occur in the active region of the LEDs. Non-radiative recombination processes in the active region may include Shockley-Read-Hall (SRH) recombination at defect sites and eeh/ehh Auger recombination, which is a non-radiative process involving three carriers. The internal quantum efficiency of an LED may be determined by:

$$IQE = \frac{BN^2}{AN + BN^2 + CN^3}, \quad (2)$$

where A, B and C are the rates of SRH recombination, bimolecular (radiative) recombination, and Auger recombination, respectively, and N is the charge-carrier density (i.e., charge-carrier concentration) in the active region.

Figure 8:
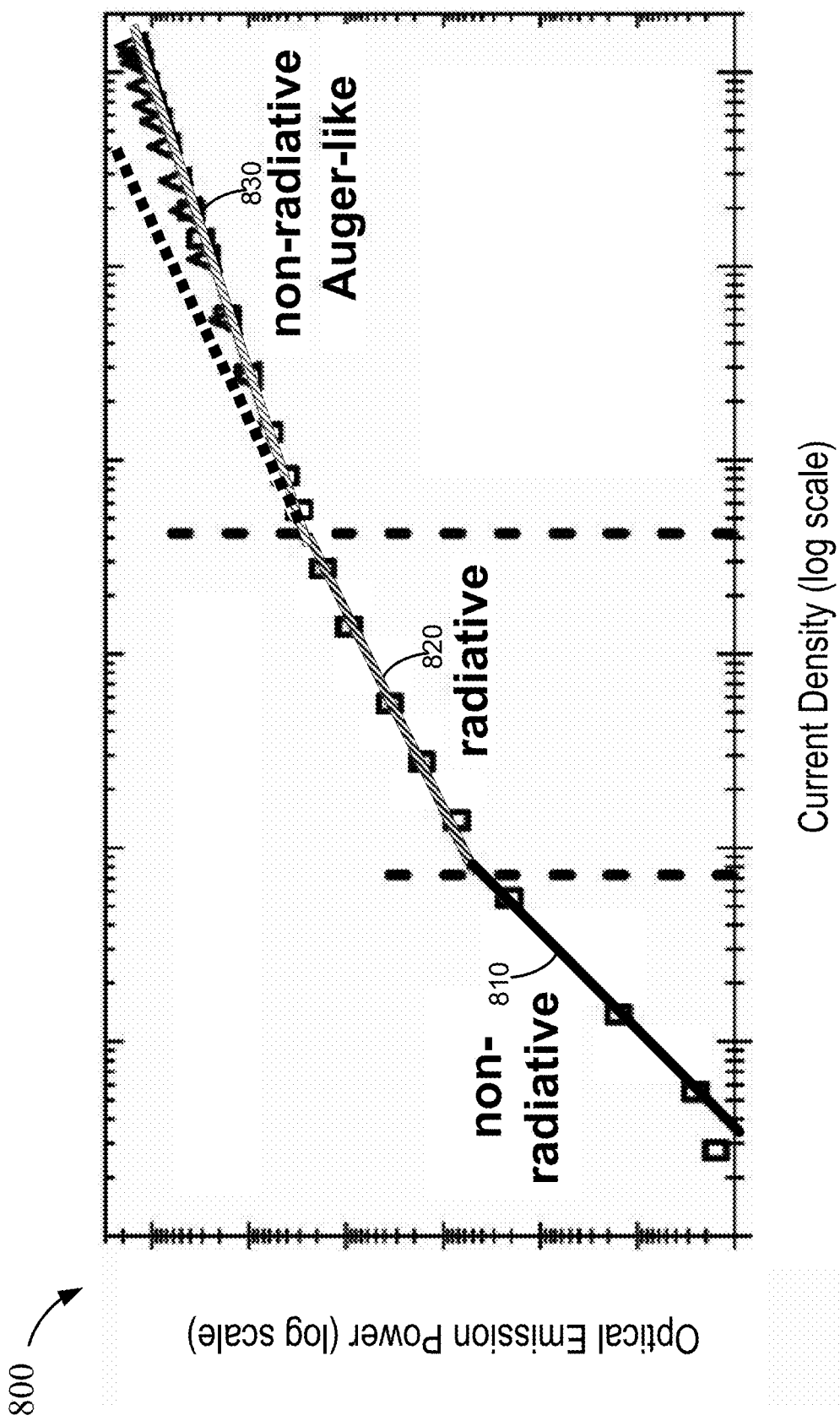
FIG. 8 illustrates the relationship between the optical emission power and the current density of a light emitting diode.

FIG. 8 illustrates the relationship between the optical emission power and the current density of a light emitting diode. As illustrated by a curve 810 in FIG. 8, the optical emission power of a micro-LED device may be low when the current density (and thus the charge carrier density N) is low, where the low external quantum efficiency may be caused by the relatively high non-radiative SRH recombination when the charge carrier density N is low according to equation (2). As the current density (and thus the charge carrier density N) increases, the optical emission power may increase as shown by a curve 820 in FIG. 8, because the radiative recombination may increase at a higher rate ($\propto N^2$) than the non-radiative SRH recombination ($\propto N$) when the charge carrier density N is high according to equation (2). As the current density increases further, the optical emission power may increase at a slower rate as shown by a curve 830 in FIG. 8 and thus the external quantum efficiency may drop as well because, for example, the non-radiative Auger recombination may increase at a higher rate ($\propto N^3$) than the radiative recombination ($\propto N^2$) when the charge carrier density N is sufficiently high according to equation (2).

Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = qd_{\text{eff}}(AN + BN^2 + CN^3), \quad (3)$$

where $d_{\text{eff}}$ is the effective thickness of the active region. Thus, according to equation (3), the effect of the Auger recombination may be reduced and thus the IQE of the LED may be improved by reducing the charge-carrier density N for a given injection current density, which may be achieved by increasing the effective thickness of the active region $d_{\text{eff}}$. The effective thickness of the active region may be increased by, for example, growing multiple quantum wells (MQWs). Alternatively, an active region including a single thick double heterostructure (DH) may be used to increase the effective thickness of the active region.

One factor affecting the effective thickness of the active region is the presence of internal fields $E_{qw}$ (e.g., strain-induced internal field) in the quantum wells. Internal fields $E_{qw}$ may localize charge carriers and reduce the overlap integral between carrier wave functions, which may reduce the radiative efficiency of LEDs. Some LEDs including heterostructures (e.g., quantum wells) may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well, thereby decreasing the spatial electron-hole overlap and reducing the radiative recombination efficiency and thus the internal quantum efficiency of the LED.

While the Auger recombination due to a high current density (and high charge carrier density) may be an intrinsic process depending on material properties, non-radiative SRH recombination depends on the characteristics and the quality of material, such as the defect density in the active region. As described above with respect to FIGS. 7A and 7B, LEDs may be fabricated by etching a mesa structure into the active emitting layers to confine carriers within the injection area of the device and to expose the n-type material beneath the active emitting layers for electrical contact. Etching the mesa structures may lead to the formation of mesa sidewalls that are orthogonal to the growth plane. As described above, due to the etching, the active region in proximity to the exposed sidewalls may have a higher density of defects, such as dislocations, pores, grain boundaries, vacancies, inclusion of precipitates, and the like. The defects may introduce energy states having deep or shallow energy levels in the bandgap. Carriers may be trapped by these energy states until they combine non-radiatively. Therefore, the active region in proximity to the exposed sidewalls may have a higher rate of SRH recombination than the bulk region that is far from the sidewalls.

Parameters that may affect the impact on the LED efficiency by the non-radiative surface recombination may include, for example, the surface recombination velocity (SRV) S, the carrier diffusion coefficient (diffusivity) D, and the carrier life time τ. The high recombination rate in the vicinity of the sidewall surfaces due to the high defect density may depend on the number of excess carriers (in particular, the minority carriers) in the region. The high recombination rate may deplete the carriers in the region. The depletion of the carriers in the region may cause carriers to diffuse to the region from surrounding regions with higher carrier concentrations. Thus, the amount of surface recombination may be limited by the surface recombination velocity Sat which the carriers move to the regions near the sidewall surfaces. The carrier life time r is the average time that a carrier can spend in an excited state after the electron-hole generation before it recombines with another carrier. The carrier life time ti generally depends on the carrier concentration and the recombination rate in the active region. The carrier diffusion coefficient (diffusivity) D of the material and the carrier life time τ may determine the carrier diffusion length $L=\sqrt{D\times\tau}$, which is the average distance a carrier can travel from the point of generation until it recombines. The carrier diffusion length L characterizes the width of the region that is adjacent to a sidewall surface of the active region and where the contribution of surface recombination to the carrier losses is significant. Charge carriers injected or diffused into the regions that are within a minority carrier diffusion length from the sidewall surfaced may be subject to the higher SRH recombination rate.

A higher current density (e.g., in units of amps/cm$^2$) may associated with a lower surface recombination velocity as the surface defects may be more and more saturated at higher carrier densities. Thus, the surface recombination velocity may be reduced by increasing the current density. In addition, the diffusion length of a given material may vary with the current density at which the device is operated. However, LEDs generally may not be operated at high current densities. Increasing the current injection may also cause the efficiencies of the micro-LEDs to drop due to the higher Auger recombination rate and the lower conversion efficiency at the higher temperature caused by self-heating at the higher current density.

For traditional, broad area LEDs used in lighting and backlighting applications (e.g., with an about 0.1 mm$^2$ to about 1 mm$^2$ lateral device area), the sidewall surfaces are at the far ends of the devices. The devices can be designed such that little or no current is injected into regions within a minority carrier diffusion length of the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewall surface. Therefore, more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 μm×100 μm×2 μm mesa, the side-wall surface area to volume ratio may be about 0.04. However, for a second LED with a 5 μm×5 μm×2 μm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be reduced significantly.

AlGaInP material may have a high surface recombination velocity and minority carrier diffusion length than some other light emission materials, such as III-nitride materials. For example, red AlGaInP LEDs may generally operate at a reduced carrier concentration (e.g., about 10$^{17}$ to 10$^{18}$ cm$^{-3}$), and thus may have a relatively long carrier life time τ. The carrier diffusivity D in the active region in the undoped quantum wells of red AlGaInP LEDs may also be rather large. As a result, the carrier diffusion length $L=\sqrt{D\times\tau}$ can be, for example, about 10-25 μm or longer in some devices. In addition, the surface recombination velocity of AlGaInP material may be an order of magnitude higher than the surface recombination velocities of III-nitride materials. Thus, compared with LED made of III-nitride materials (e.g., blue and green LEDs made of GaN), the internal and external quantum efficiencies of AlGaInP-based red LEDs can drop even more significantly as the device size decreases.

Figure 9:
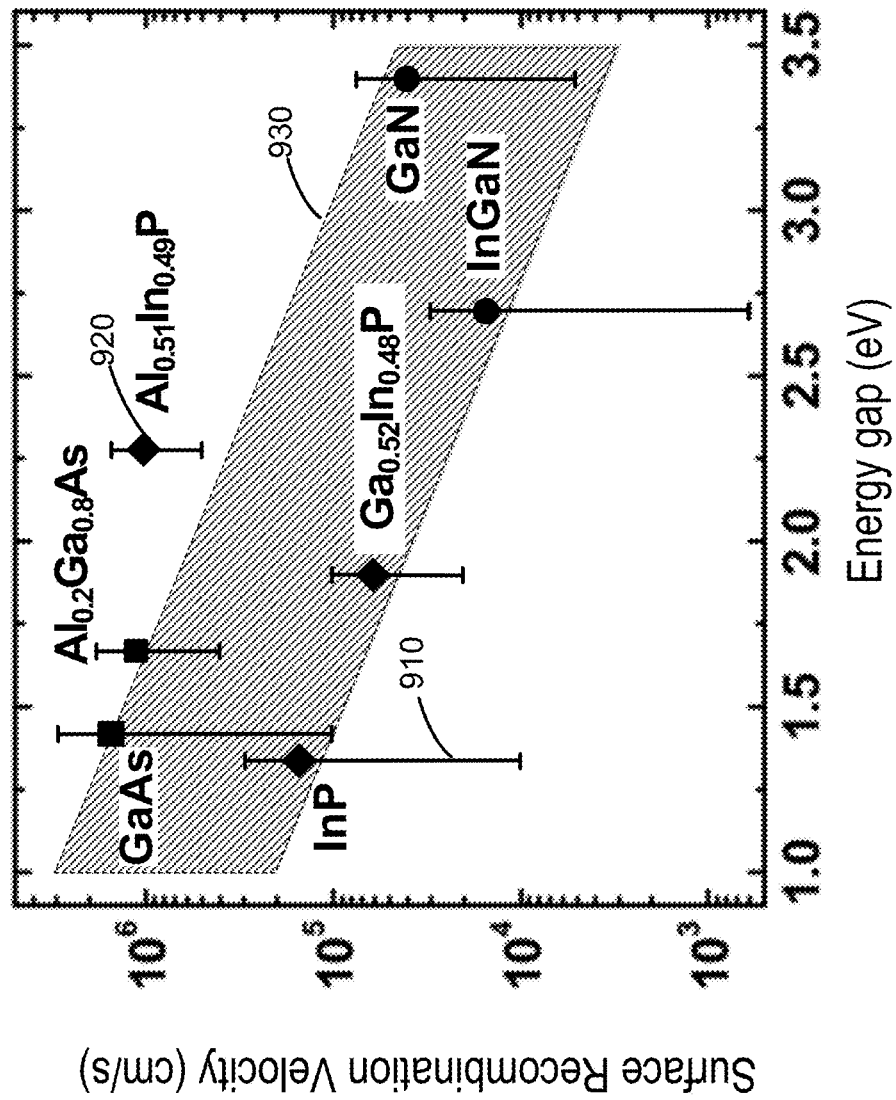
FIG. 9 illustrates surface recombination velocities of various III-V semiconductors.

FIG. 9 illustrates surface recombination velocities of various III-V semiconductor materials. Bars 910 in FIG. 9 show the ranges of reported SRV values of the III-V semiconductor materials, whereas symbols 920 on bars 910 indicate the common or averaged SRVs. A box 930 shows a general trend of the surface recombination velocity variation with the materials bandgap. As illustrated in FIG. 9, the SRV is high in GaAs (S~10$^6$ cm/s) compared to InP (S~10$^5$ cm/s) or GaN (S less than about 0.5×10$^5$ cm/s). The surface recombination velocity of AlGaInP material (e.g., ~10$^6$ cm/s) may be at least an order of magnitude higher than the surface recombination velocity of III-nitride materials (e.g., <10$^5$ cm/s). In addition, in Al-containing alloys, such as AlGaInP, SRVs may scale appreciably with the Al fraction. For example, the SRV may increase from about 10$^5$ cm/s for $(Al_{0.1}Ga_{0.9})_{0.5}In_{0.5}P$ to about 10$^6$ cm/s for $Al_{0.51}In_{0.49}P$.

In addition, nitride LEDs can operate at non-equilibrium carrier concentrations much higher than phosphide LEDs, which results in considerably shorter carrier lifetime in nitride LEDs. Therefore, the carrier diffusion lengths in the active regions of III-nitride LEDs are considerably shorter than the carrier diffusion lengths in phosphide LEDs. As such, phosphide LEDs, such as AlGaInP-based red micro-LEDs may have both higher SRVs and longer carrier diffusion lengths, and thus may have much higher surface recombination and efficiency reduction, than III-nitride LEDs.

Figures 10A, 10B:
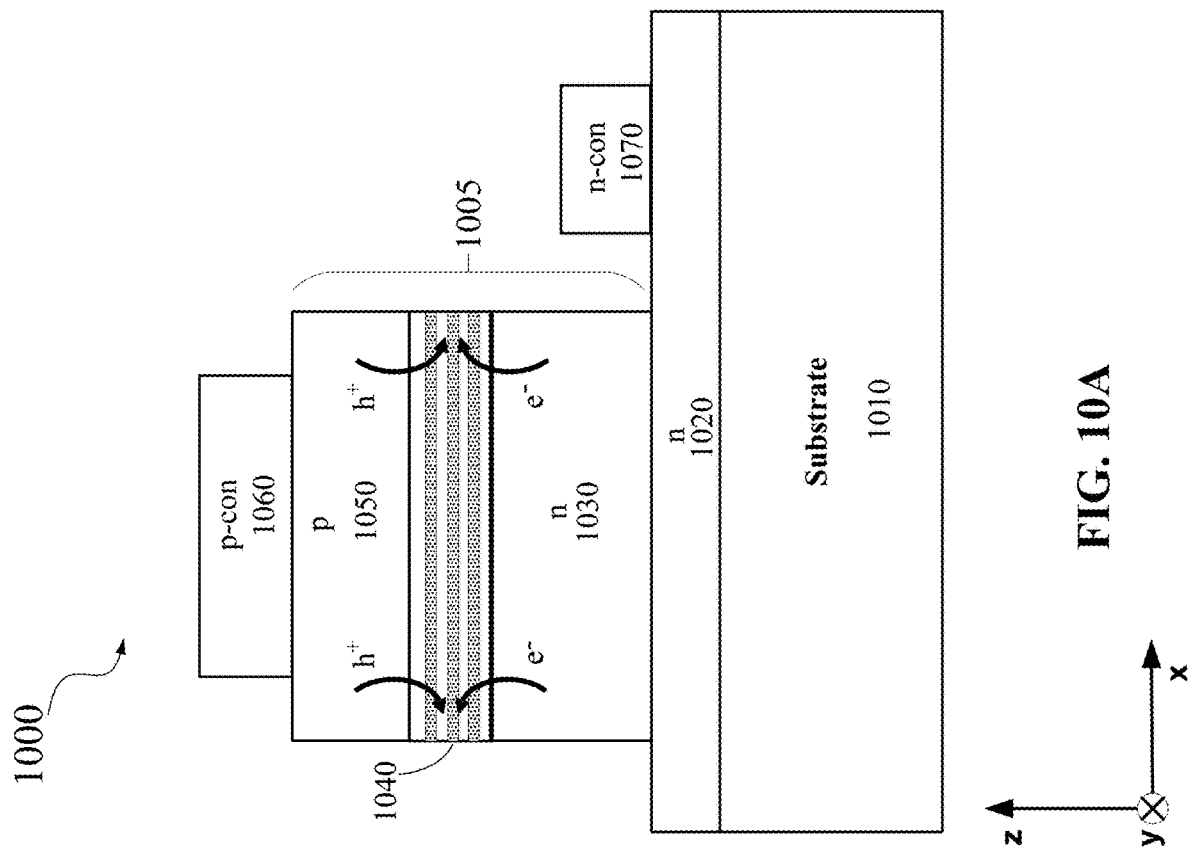
FIG. 10A illustrates an example of a micro-LED having a mesa structure.
FIG. 10B illustrates a simplified energy band diagram of a quantum well layer of the micro-LED of FIG. 10A near a sidewall surface of the micro-LED.

FIG. 10A illustrates an example of a micro-LED 1000 having a mesa structure 1005. Micro-LED 1000 may be an example of LED 700 or 705. Micro-LED 1000 may include an n-type semiconductor layer 1020 epitaxially grown on a substrate 1010 that may be similar to substrate 710 or 715. In one example, substrate 1010 may include a GaN substrate or a sapphire substrate with a buffer layer, and n-type semiconductor layer 1020 may include a GaN layer doped with, for example, Si or Ge. In another example, substrate 1010 may include a GaAs substrate. One or more epitaxial layers, such as GaN barrier layers and InGaN quantum well layers, or AlGaInP barrier layers and InGaP quantum well layers, may be grown on n-type semiconductor layer 1020 to form active layers 1040.

Active layers 1040 of micro-LED 1000 may include multiple quantum well layers each sandwiched by two barrier layers. The quantum well layer may have a lower energy level and a narrower bandgap between the conduction band and the valence band than the barrier layer. Carriers (electrons and holes) injected into the active region may be confined by the energy barriers to the quantum well layers, where the electrons and holes may recombine to emit light. The wavelength of the emitted light may depend on the bandgap of the light emitting layers (e.g., the quantum well layers). For example, in an InGaN LED, the energy bandgap of the barrier layers (e.g., GaN layer) may be higher than the energy bandgap of the quantum well layers (e.g., InGaN layers), which may decrease (and thus the wavelength of the emitted light may increase) as the proportion of Indium in InGaN increases. In an AlGaInP LED, the energy bandgap of the quantum well layers may be engineered (e.g., by tuning the composition) to emit red light.

A p-type semiconductor layer 1050 may be grown on active layers 1040. P-type semiconductor layer 1050 may be doped with, for example, Mg, Ca, Zn, or Be. The layer stack may then be etched to form individual mesa structures 1005 that each include a p-type semiconductor region, an active region that includes active layers 1040, and a region 1030 of n-type semiconductor layer 1020. Mesa structure 1005 may have a lateral linear dimension (e.g., in the x direction) less than about 100 µm, less than about 50 µm, less than about 20 µm, less than about 10 µm, less than about 5 µm, less than about 3 µm, less than about 2 µm, or smaller. P-contacts 1060 and n-contacts 1070 may be formed on p-type semiconductor layer 1050 and the exposed n regions of n-type semiconductor layer 1020, respectively. Each p-contact 1060 may include, for example, a metal layer (e.g., Al, Au, Ni, Ti, Ag, or any combination thereof), or an indium tin oxide (ITO) and/or Al/Ni/Au film. In some embodiments, p-contact 1060 may include a metal reflector (e.g., Ag) to reflect emitted light towards n-type semiconductor layer 1020. Each n-contact 1070 may also include a layer of a metal material, such as Al, Au, Ni, Ti, or any combination thereof.

Even though not shown in FIG. 10A, a passivation layer, such as an oxide layer (e.g., a $SiO_2$ layer) or another dielectric layer, may be formed on sidewalls of mesa structure 1005. The passivation layer may have a lower refractive index than the active region and may function as a reflector (e.g., due to total internal reflection) to reflect certain emitted light out of micro-LED 1000 as described above. In some embodiments, a metal layer may be formed on the passivation layer to form a sidewall metal reflector. Even though FIG. 10A shows a vertical mesa structure, micro-LED 1000 may have a different mesa shape, such as a conical, parabolic, inward-tilted, or outward-tilted mesa shape. A dielectric material (e.g., $SiO_2$) may be deposited to fill gaps between micro-LED 1000 and adjacent micro-LEDs.

When a voltage or current signal is applied to p-contact 1060 and n-contact 1070, holes and electrons may be injected into active layers 1040 from p-type semiconductor layer 1050 and region 1030 of n-type semiconductor layer 1020, respectively. The electrons and holes may be confined in the quantum wells of active layers 1040 and may recombine in the quantum wells, where the recombination of electrons and holes may cause photon emission. The emitted photons may be reflected by the passivation layer and/or the metal reflector, and may exit micro-LED 1000 from the bottom (e.g., n-type semiconductor layer 1020 side with substrate 1010 thinned or removed) or the top (e.g., p-contact 1060 side). At the sidewalls of the mesa structure, active layers 1040 may have a higher density of defects, such as dislocations, dangling bonds, pores, grain boundaries, vacancies, inclusion of precipitates, and the like, due to the abrupt ending of the lattice structure and the etching. As such, surface states having energy levels within the bandgap of the bulk semiconductor may be present at the sidewall regions. Holes and electrons injected into the quantum wells of active layers 1040 may diffuse to the sidewall regions, and may recombine via the surface states without generating photons. As such, there may be a high carrier leakage at the mesa side wall, and the internal/external quantum efficiency of micro-LED 1000 may be low, at least due to the losses caused by the non-radiative surface recombination.

FIG. 10B illustrates a simplified energy band diagram 1002 of a quantum well layer of active layers 1040 near a sidewall surface of micro-LED 1000. A curve 1084 in FIG. 10B shows the conduction band of the quantum well layer, a curve 1080 shows the valence band of the quantum well layer, and a line 1082 shows the Fermi level. As illustrated, the conduction band and the valence band may be flat at the center region of the quantum well layer. At the mesa sidewalls, due to crystal structure discontinuity and defects at the interface between the quantum well layer and an insulator (e.g., air or a dielectric layer, such as an oxide layer), surface states 1086 having energy levels within the bandgap of the quantum well layer may be present at the semiconductor/insulator interface. Surface states 1086 may cause Fermi level pinning at the charge neutrality level at the interface and thus energy band bending at the sidewall region, where the amount of energy band bending may be proportional to the surface potential cps. Due to the bending of the energy bands, electrons 1090 may more easily move to the sidewall regions and non-radiatively recombine with holes via the surface states at the defect sites near the mesa sidewalls. Thus, the IQE of micro-LED 1000 may be low due to the leakage caused by the non-radiative recombination at the sidewall regions.

In micro-LEDs described above, the p-type semiconductor layer, the active region, and the n-type semiconductor layer may form a vertical p-i-n structure where the p-type semiconductor layer and the n-type semiconductor layer may be on opposite sides of the active region to inject holes and electrons, respectively into the active region from opposite directions. The injected carriers may diffuse laterally to the sidewall regions due to the energy band bending shown in FIG. 10B.

FIG. 11A illustrates an example of a micro-LED 1100 having a vertical p-i-n structure. In the illustrated example, micro-LEDs 1100 may include a p-i-n structure that includes a p-type semiconductor layer 1140 (e.g., p-doped GaN or AlGaInP), an active region 1130 (e.g., undoped or unintentionally doped GaN/InGaN quantum wells or AlGaInP/InGaP quantum wells), and an n-type semiconductor layer (e.g., n-doped GaN or AlGaInP) arranged along the vertical direction (e.g., z direction). P-type semiconductor layer 1140 and n-type semiconductor layer 1120 may be on opposite sides of active region 1130. The p-i-n structure may be epitaxially grown on a substrate 1110, such as GaAs, silicon, sapphire, or the like. As illustrated, when the p-i-n structure is forward biased, current may flow from p-type semiconductor layer 1140, through active region 1130, to n-type semiconductor layer 1120. As such, holes may be injected into active region 1130 from p-type semiconductor layer 1140 and electrons may be injected into active region 1130 from n-type semiconductor layer 1120.

In large micro-LEDs, the linear lateral sizes of the micro-LEDs may be at least an order higher that the thickness of the epitaxial structure, and thus the carriers may radiatively recombine before diffusing to the mesa sidewalls. For small micro-LEDs (e.g., having a pitch less than about 10 µm, less than about 5 µm, less than about 4 µm, less than about 3 µm, or smaller), the lateral sizes of the micro-LEDs may be comparable to the thickness of the epitaxial structure (e.g., less than a few microns or less than one or two microns). Therefore, the current injection path and the current density in the lateral direction may be comparable to those in the vertical direction. As such, the proportion of carriers injected into the active region and laterally (e.g., in the x or y direction) drifted to the sidewall regions of the active region may be higher because of the relatively small lateral size. Thus, in the vertical micro-LEDs described above, the lateral current in the active region may increase the no-radiative recombination at the sidewall regions and thus may reduce the quantum efficiency of the micro-LEDs.

According to certain embodiments, lateral current in the active region may be utilized to transport carriers between the p-type semiconductor region and the n-type semiconductor region that are in different lateral regions of a micro-LED, such that most injected carriers may radiatively recombine at or near the center of the active region during the lateral movement, before diffusing to sidewall regions of the active region. The lateral current injection may be achieved by, for example, positioning the n-type semiconductor region and the p-type semiconductor region at different lateral regions on a same side of the active region, and laterally confining the p-type semiconductor region (or the n-type semiconductor region) by the n-type semiconductor region (or the p-type semiconductor region). Therefore, under a forward bias, current may horizontally flow in the active region from regions under the p-type semiconductor region to regions under the n-type semiconductor region, and uncombined carriers may be collected by the p-type semiconductor region or the n-type semiconductor region before diffusing to the sidewall regions.

Unlike a conventional vertical LED, in a lateral LED disclosed herein, the electric field in the active region is in plane with the quantum wells. This may create a potential barrier for at least one type of charge carriers (e.g., holes or electrons), preventing them from moving towards mesa sidewalls via diffusion. In some lateral micro-LED arrangements including one n-type semiconductor region and one p-type semiconductor region, the other type of charge carriers may be able to diffuse to mesa sidewalls and recombine there non-radiatively. A more effective construction of the lateral micro-LED may include a central doped region, where the majority carriers possess lower diffusivity (mobility) in the quantum wells. For example, in the InGaAlP material system, the majority carriers are holes and the central region is p-type doped as shown and described below.

FIG. 11B illustrates an example of a lateral micro-LED 1105 according to certain embodiments. In the illustrated example, lateral micro-LED 1105 may include a substrate 1115, such as GaAs, silicon, sapphire, or the like. In some embodiments, substrate 1115 may be lightly n-doped (e.g., with a doping density about $1\times10^{16}$ cm$^{-3}$). Multiple epitaxial layers may be grown on substrate 1115. The epitaxial layers may include a cladding layer 1125 (e.g., an undoped or lightly p-doped GaN or AlGaInP layer), an active region 1135 (e.g., including multiple quantum wells formed by quantum well layers between barrier layers, such as an unintentionally doped barrier layer 1132), a p-type semiconductor region 1145, and an n-type semiconductor region 1150 surrounding p-type semiconductor region 1145. P-type semiconductor region 1145 and n-type semiconductor region 1150 may be in different lateral region of lateral micro-LED 1105, and may be formed in a same epitaxial layer or may be formed by two separate epitaxial growing processes. There may be a narrow isolation region 1160 (e.g., a dielectric material or an air gap) between p-type semiconductor region 1145 and n-type semiconductor region 1150 to isolate p-type semiconductor region 1145 and n-type semiconductor region 1150 and to prevent current from flowing directly between p-type semiconductor region 1145 and n-type semiconductor region 1150 without going through active region 1135. Isolation region 1160 may have a width between tens of nanometers to a few hundred nanometers.

As illustrated, the p-i-n structure of lateral micro-LED 1105 may be different from the p-i-n structure of micro-LED 1100, and may include p-type semiconductor region 1145 and n-type semiconductor region 1150 at different lateral regions, where active region 1135 may be below p-type semiconductor region 1145 and n-type semiconductor region 1150. When the p-i-n structure is forward biased, current may flow from p-type semiconductor region 1145, through active region 1135, to n-type semiconductor region 1150, where the carriers may move laterally in active region 1135 from regions below p-type semiconductor region 1145 to regions below n-type semiconductor region 1150. Holes may be injected into active region 1135 from p-type semiconductor region 1145 and electrons may be injected into active region 1135 from n-type semiconductor region 1150. Due to the forward biasing, energy bands in the p-i-n structure may favor the drift of holes from the regions below p-type semiconductor region 1145 to the regions below n-type semiconductor region 1150 and may favor the drift of electrons from the regions below n-type semiconductor region 1150 to the regions below p-type semiconductor region 1145. Holes and carriers may recombine during the lateral movement within active region 1135 to emit light. Unrecombined carriers, if any, may reach the p-type semiconductor region (which may collect electrons) or the n-type semiconductor region (which may collect holes) before they may reach the mesa sidewalls of lateral micro-LED 1105.

Because the mesa sidewalls are located away from the current injection paths, fewer carriers may diffuse to the sidewall regions of active region 1135 to non-radiatively recombine via the surface states within the bandgap at defect sites. As such, the internal quantum efficiency of lateral micro-LED 1105 may be improved due to the lower efficiency reduction caused by non-radiative recombination at the sidewall regions as the physical dimension of the micro-LED decreases. For example, the IQE of a lateral micro-LED may be in the same order as the IQE of a macro-LED (e.g., about 50%), and may remain approximately constant as the physical dimension of the micro-LED decreases. As such, the reduction of the physical dimension may have little or minimum impact on the IQE of lateral micro-LEDs. Therefore, lateral micro-LED structures disclosed herein may be especially beneficial for small micro-LEDs, such as small red light-emitting AlGaInP-based micro-LEDs, which may otherwise have significant efficiency reduction as the physical dimension reduces as described above.

Lateral micro-LED 1105 may be fabricated by, for example, growing an epitaxial layer and diffusing (or implanting) different dopants in different regions of the epitaxial layer to form the p-type semiconductor region and the n-type semiconductor region. In one example, the epitaxial layer may be undoped or n-doped (e.g., with silicon or germanium), the center region of the epitaxial layer may be p-doped by, for example, zinc, magnesium, or cadmium diffusion through a diffusion mask. In some embodiments, the epitaxial layer may be etched to separate the p-type semiconductor region and the n-type semiconductor region. The gap between the p-type semiconductor region and the n-type semiconductor region may be filled with a dielectric layer (e.g., silicon oxide) to isolate the p-type semiconductor region and the n-type semiconductor region.

In some embodiments, lateral micro-LED 1105 may be fabricated by performing two epitaxial growth processes, where the first epitaxial growth process may be used to grow a first doped layer (e.g., p-type semiconductor layer) on the active region, portions (e.g., peripheral regions) of the first doped layer may be removed (e.g., by dry or wet etching), and then a second growth process may be performed to grow a second doped layer (e.g., n-type semiconductor layer) in regions (e.g., the peripheral regions) where the first doped layer has been removed. After the formation of the p-i-n structures of the micro-LEDs, mesa structures of the micro-LEDs may be formed, for example, by dry etching or wet etching. Processes for applying a passivation layer on the mesa sidewalls, forming sidewall reflectors, forming back reflectors, forming metal contacts, and the like, may then be performed to make lateral micro-LED 1105.

FIG. 12A illustrates an example of a lateral micro-LED 1200 according to certain embodiments. Lateral micro-LED 1200 may be an example of lateral micro-LED 1105 described above. Lateral micro-LED 1200 shown in FIG. 12A may include a substrate 1210 (e.g., GaAs), a cladding layer 1220 (e.g., AlGaInP), and an active region that includes multiple pairs (e.g., more than 10 pairs, 10 pairs, or fewer than 10 pairs) of a quantum well layer (e.g., quantum well layer 1232 or 1236, such as an InGaP layer) and a barrier layer (e.g., barrier layer 1234 or 1238, such as an AlGaInP layer). A p-type semiconductor region 1240 (e.g., p-doped AlGaInP) and one or more n-type semiconductor region 1250 (e.g., n-doped AlGaInP) may be formed on the active region as described above. In the illustrated example, lateral micro-LED 1200 may have a lateral linear dimension (e.g., in the x direction) about 4 μm, where p-type semiconductor region 1240 may have a lateral linear dimension about 2 μm and n-type semiconductor region 1250 may have a width about 1 μm. P-type semiconductor region 1240 and n-type semiconductor region 1250 may be separated by an isolation region that may have a width about 100 nm. The total thickness of the structure shown in FIG. 12A may be less than about 2 μm.

In some embodiments, substrate 1210 may be lightly n-doped, for example, with a doping density about $1\times10^{16}$ cm$^{-3}$, or may be unintentionally doped. Cladding layer 1220 may be lightly p-doped, for example, with a doping density about $1\times10^{16}$ cm$^{-3}$, or may be unintentionally doped. Cladding layer 1220 may have a thickness about a few hundred nanometers, such as about 500 nm or about 700 nm. Each quantum well layer 1232 or 1236 may be unintentionally doped, and may have a thickness about a few nanometers, such as between about 2 nm and about 10 nm. Each barrier layer 1234 or 1238 may have a thickness greater than the thickness of quantum well layer 1232 or 1236, such as about 10 nm, between about 10 and about 20 nm, greater than about 20 nm, or the like. In one example, barrier layer 1234 may have a thickness about 10 nm, and barrier layer 1238 may have a thickness about 20 nm. P-type semiconductor region 1240 and n-type semiconductor region 1250 may each have a doping density about $1\times10^{18}$ cm$^{-3}$ or higher, and may have a thickness about 100 nm or higher.

FIG. 12B illustrates an example of simulating Fermi level pinning and surface losses at the sidewalls of the example of lateral micro-LED 1200 of FIG. 12A using different trap levels according to certain embodiments. FIG. 12B illustrates acceptor-type interface traps and donor-type interface traps at the sidewalls. For the simulations, the density of the acceptor-type interface traps in regions within about 1 nm from the sidewalls may be set to about $1\times10^{20}$ cm$^{-3}$, and the density of the donor-type interface traps may be set to about $1\times10^{20}$ cm$^{-3}$. The deep level traps may be at about 1.1 eV below the conduction band energy Ec. The non-radiative Shockley-Read-Hall (SRH) lifetime $\tau_{nr}$ of the carriers may be set to about 0.1 ns. Different surface losses may be modeled by different non-radiative lifetimes. The internal quantum efficiency may be proportional to $$\frac{\tau_r^{-1}}{\tau_r^{-1}+\tau_{nr}^{-1}},$$

where $\tau_r$ is the radiative lifetime. With a shorter non-radiative lifetime tiny, the SRH loss may be higher, and the internal quantum efficiency may be lower.

Figure 13A:
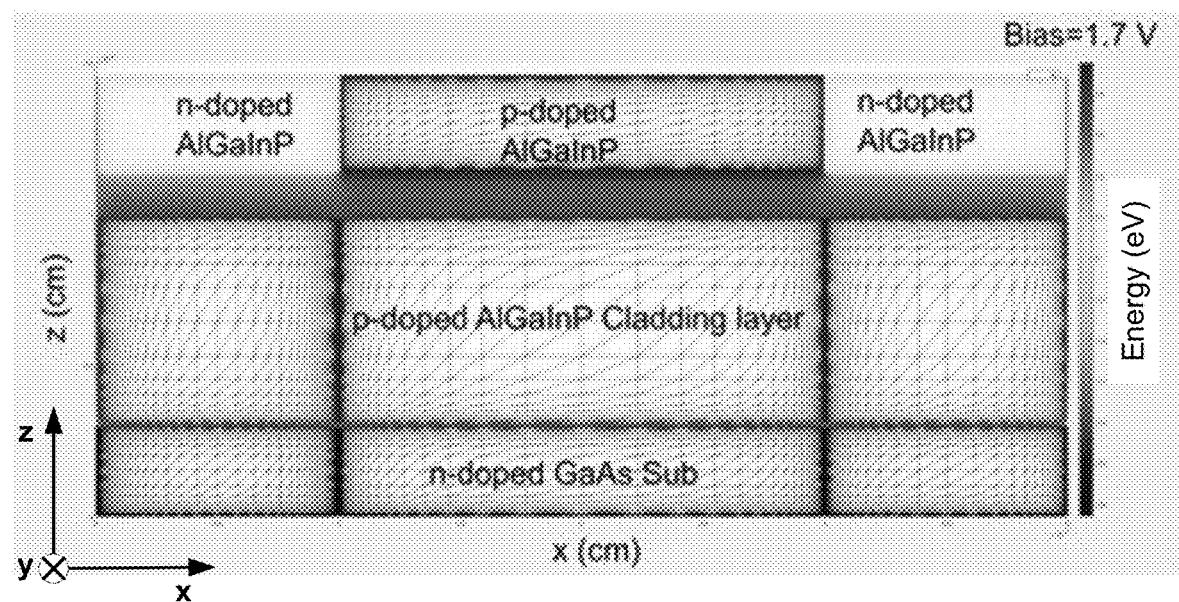
FIG. 13A illustrates a simulated two-dimensional conduction band diagram of a cross-section of the example of lateral micro-LED of FIG. 12A according to certain embodiments.
Figure 13B:
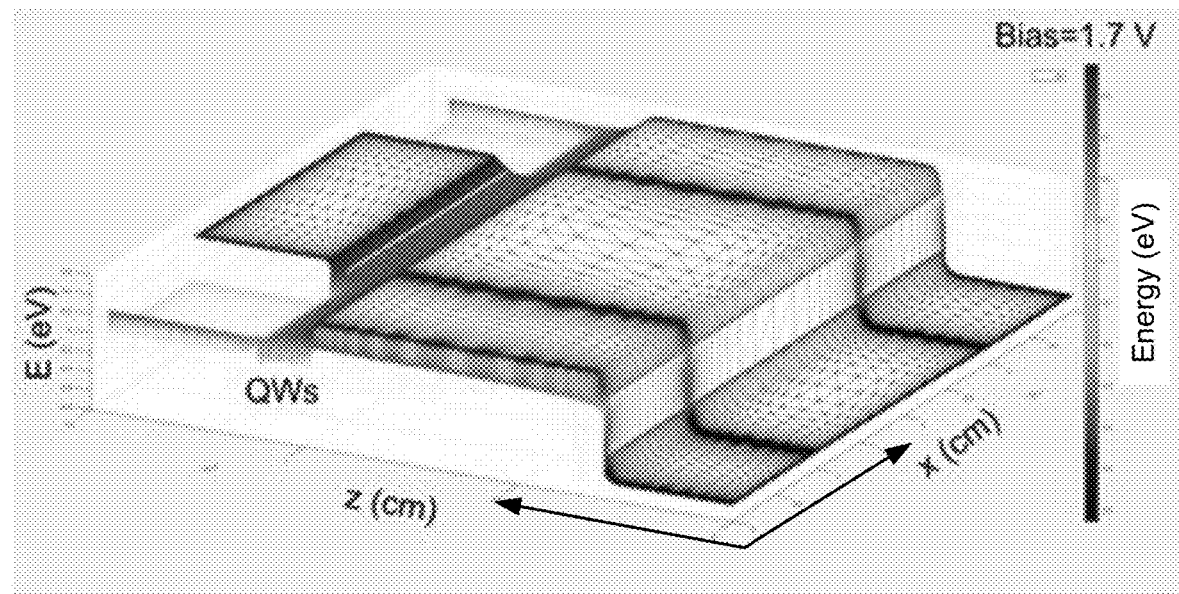
FIG. 13B illustrates a simulated three-dimensional conduction band diagram of a cross-section of the example of lateral micro-LED of FIG. 12A according to certain embodiments.

FIG. 13A illustrates a simulated two-dimensional conduction band diagram of a cross-section of the example of lateral micro-LED 1200 of FIG. 12A according to certain embodiments. FIG. 13B illustrates a simulated three-dimensional conduction band diagram of the cross-section of the example of lateral micro-LED 1200 according to certain embodiments. The simulation is based on the parameters described above with respect to FIGS. 12A and 12B, and the lateral micro-LED is biased at about 1.7V. FIGS. 13A and 13B show that p-type semiconductor region 1240 may have a higher conduction band energy level, and n-type semiconductor region 1250 may have a lower conduction band energy level. Cladding layer 1220 may also have a high conduction band energy level. The conduction band energy level of the active region may be between the conduction band energy levels of p-type semiconductor region 1240 (and cladding layer 1220) and n-type semiconductor region 1250, and may decrease from the active region below p-type semiconductor region 1240 to the active region below n-type semiconductor region 1250.

Figure 14:
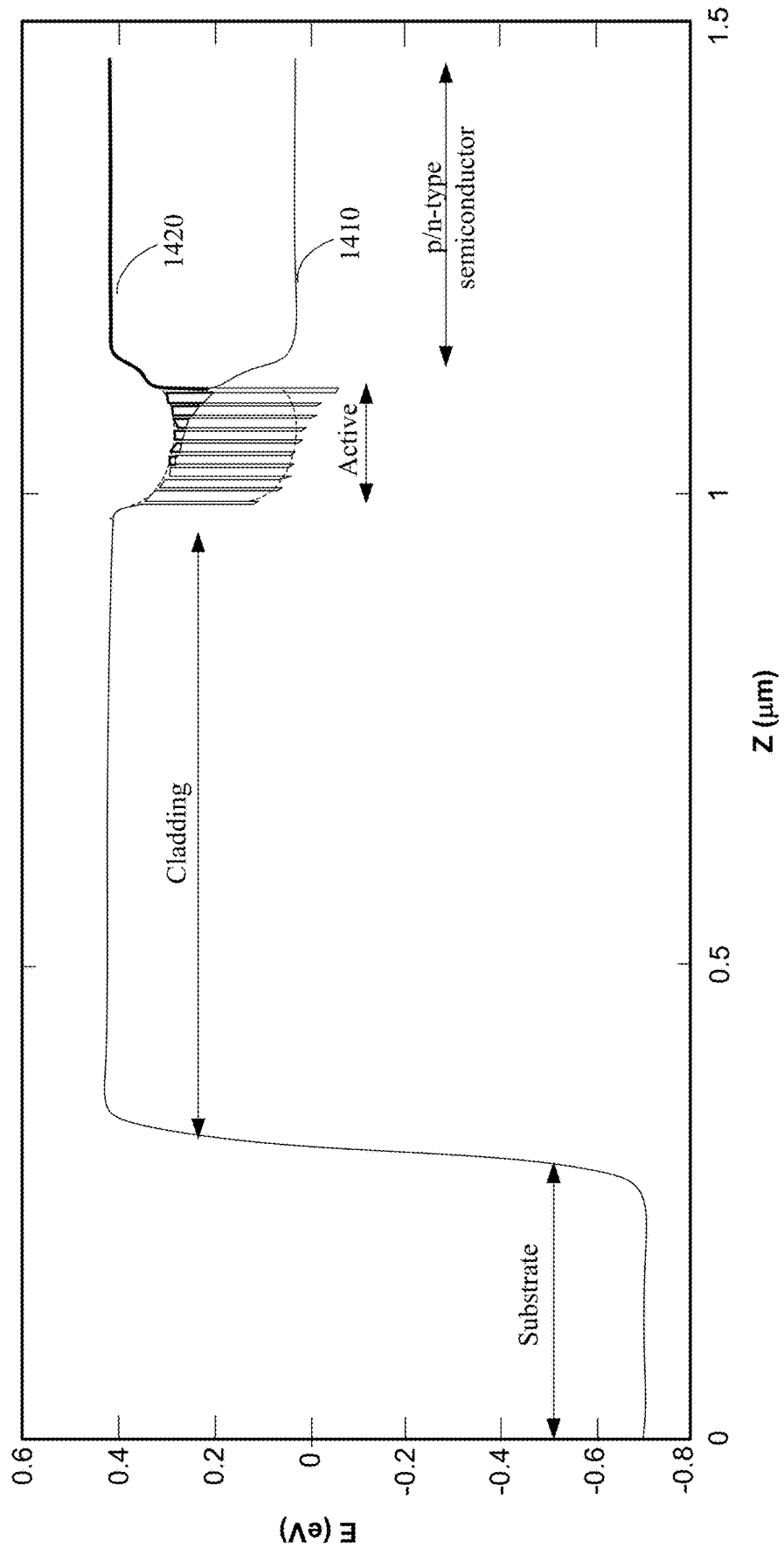
FIG. 14 illustrates simulated one-dimensional conduction band diagrams of the example of lateral micro-LED of FIG. 12A at two lateral regions (e.g., the p-type region and the n-type region) of the lateral micro-LED according to certain embodiments.

FIG. 14 simulated one-dimensional conduction band diagrams of the example of lateral micro-LED 1200 of FIG. 12A at two lateral regions (e.g., at x=0.5 μm (at and below the n-type region) at x=2 μm (at and below the p-type region)) of lateral micro-LED 1200 according to certain embodiments. In FIG. 14, a region with z values from 0 to about 0.3 μm corresponds to the substrate (e.g., substrate 1210). A region with z values from about 0.3 μm to about 1 μm corresponds to the cladding layer (e.g., cladding layer 1220). A region with z values from about 1 μm to about 1.1 μm corresponds to the active region. A region with z values above 1.1 μm corresponds to the p-type or the n-type semiconductor region. A curve 1410 in FIG. 14 shows the conduction band of lateral micro-LED 1200 at and below the n-type semiconductor region (e.g., along a line AB in FIG. 12A), and a curve 1420 in FIG. 14 shows the conduction band of lateral micro-LED 1200 at and below the p-type semiconductor region (e.g., along a line CD in FIG. 12A).

As illustrated, the conduction band of a quantum well layer closer to the p-type semiconductor layer and the n-type semiconductor layer may have a larger difference between the region below the n-type semiconductor region and the region below the p-type semiconductor region. Thus, carriers may move laterally in the quantum well layer between the region below the n-type semiconductor region and the region below the p-type semiconductor region due to the energy level difference. In addition, because the p-type semiconductor region may have a higher conduction band energy level than the active region and the n-type semiconductor region may have a lower conduction band energy level than the active region, fewer carriers may diffuse to the mesa sidewalls.

Figure 15:
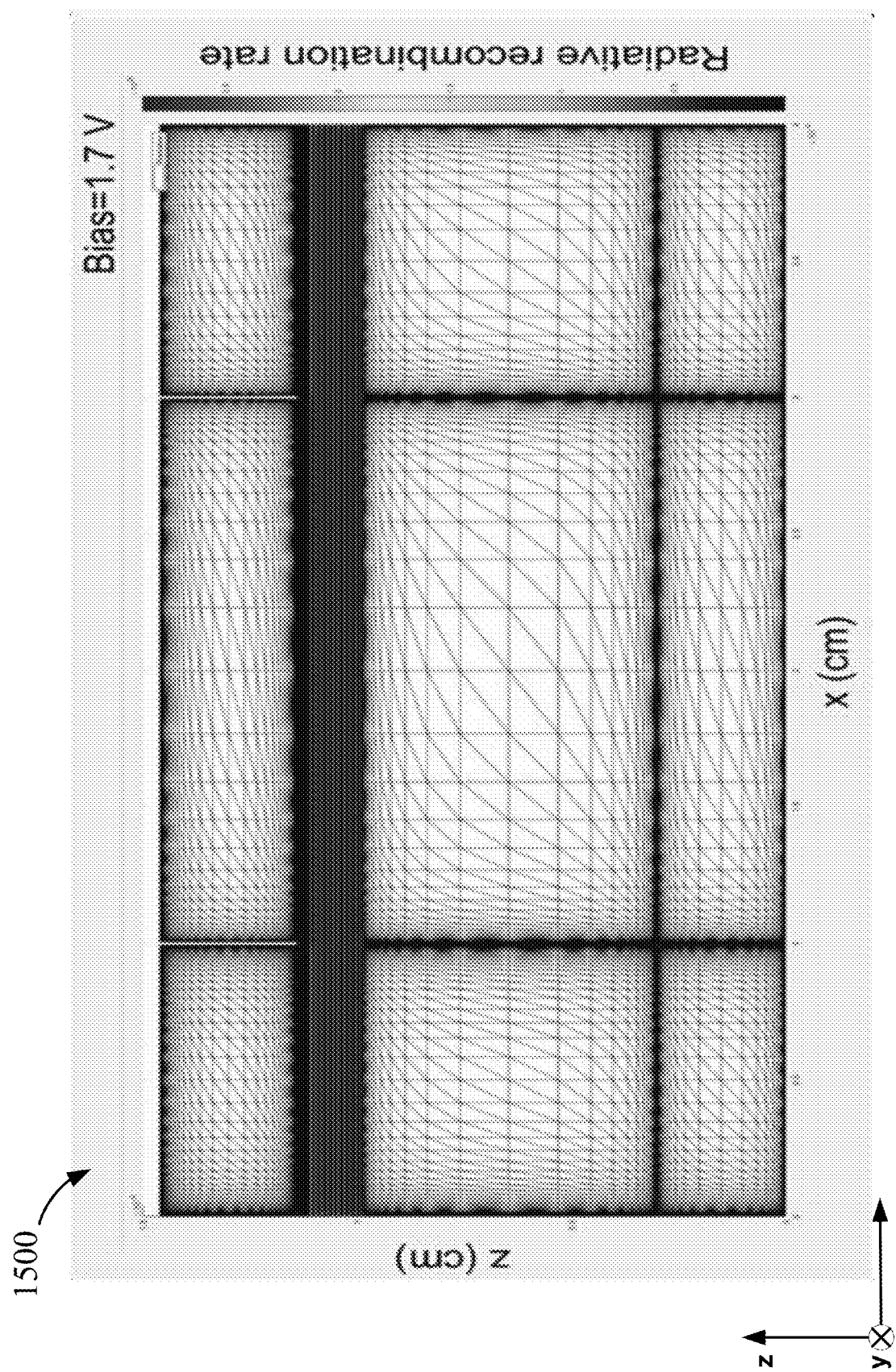
FIG. 15 illustrates simulated relative recombination rates at different regions of the example of the lateral micro-LED of FIG. 12A according to certain embodiments.

FIG. 15 illustrates simulated relative recombination rates at different regions of the example of lateral micro-LED 1200 of FIG. 12A according to certain embodiments. In the simulation, the applied bias voltage between the p-contact and the n-contact is about 1.7V. The simulation results show that the quantum well layers closer to the p-type semiconductor region and the n-type semiconductor region have higher recombination rate.

Figure 16A:
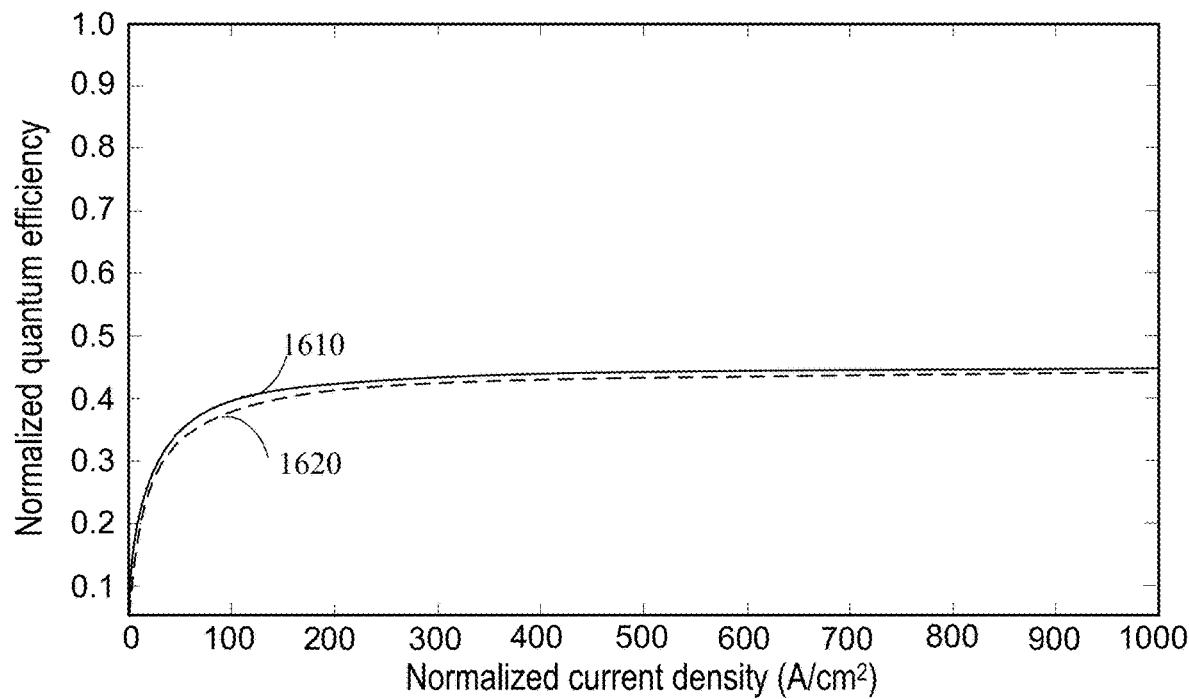
FIG. 16A illustrates simulated quantum efficiencies of an example of a lateral micro-LED with and without surface losses as a function of the current density according to certain embodiments.

FIG. 16A illustrates simulated quantum efficiencies of an example of a lateral micro-LED (e.g., lateral micro-LED 1105 or 1200) with and without surface losses as a function of the current density according to certain embodiments. A curve 1610 in FIG. 16A shows the simulated relative quantum efficiency of lateral micro-LED 1200 (with a lateral size about 4 μm) without surface losses, as a function of the normalized current density. A curve 1620 shows the simulated relative quantum efficiency of lateral micro-LED 1200 with surface losses (e.g., $\tau_{nr} \approx 100$ ps), as a function of the normalized current density. Curves 1610 and 1620 show that the lateral micro-LEDs disclosed herein may have low sensitivity to surface loss.

Figure 16B:
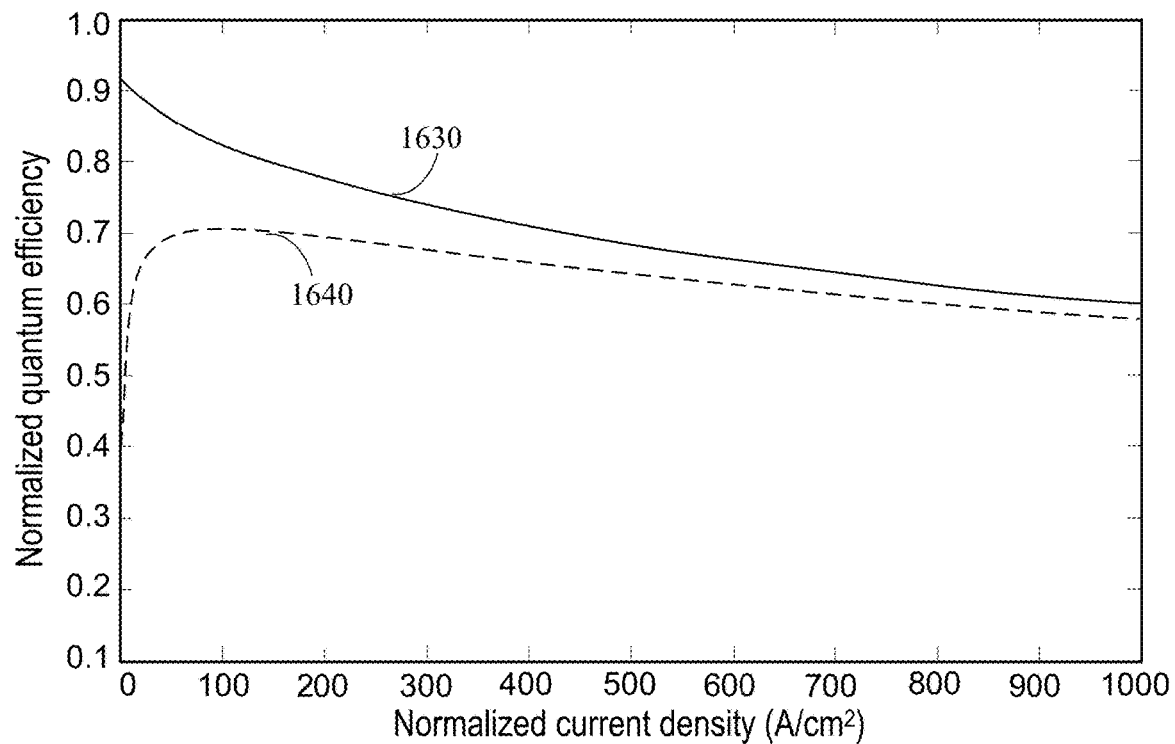
FIG. 16B illustrates simulated quantum efficiencies of an example of a vertical micro-LED with and without surface losses as a function of the current density.

FIG. 16B illustrates simulated quantum efficiencies of an example of a vertical micro-LED (e.g., micro-LED 1100) with and without surface losses as a function of the current density. The vertical micro-LED has a lateral size about 2 μm. A curve 1630 in FIG. 16B shows the simulated relative quantum efficiency of the vertical micro-LED without surface losses, as a function of the normalized current density. A curve 1640 shows the simulated relative quantum efficiency of the vertical micro-LED with surface losses (e.g., $\tau_{nr} \approx 100$ ps), as a function of the normalized current density. Curves 1630 and 1640 show that the vertical micro-LEDs may have higher sensitivity to surface loss.

Figure 17:
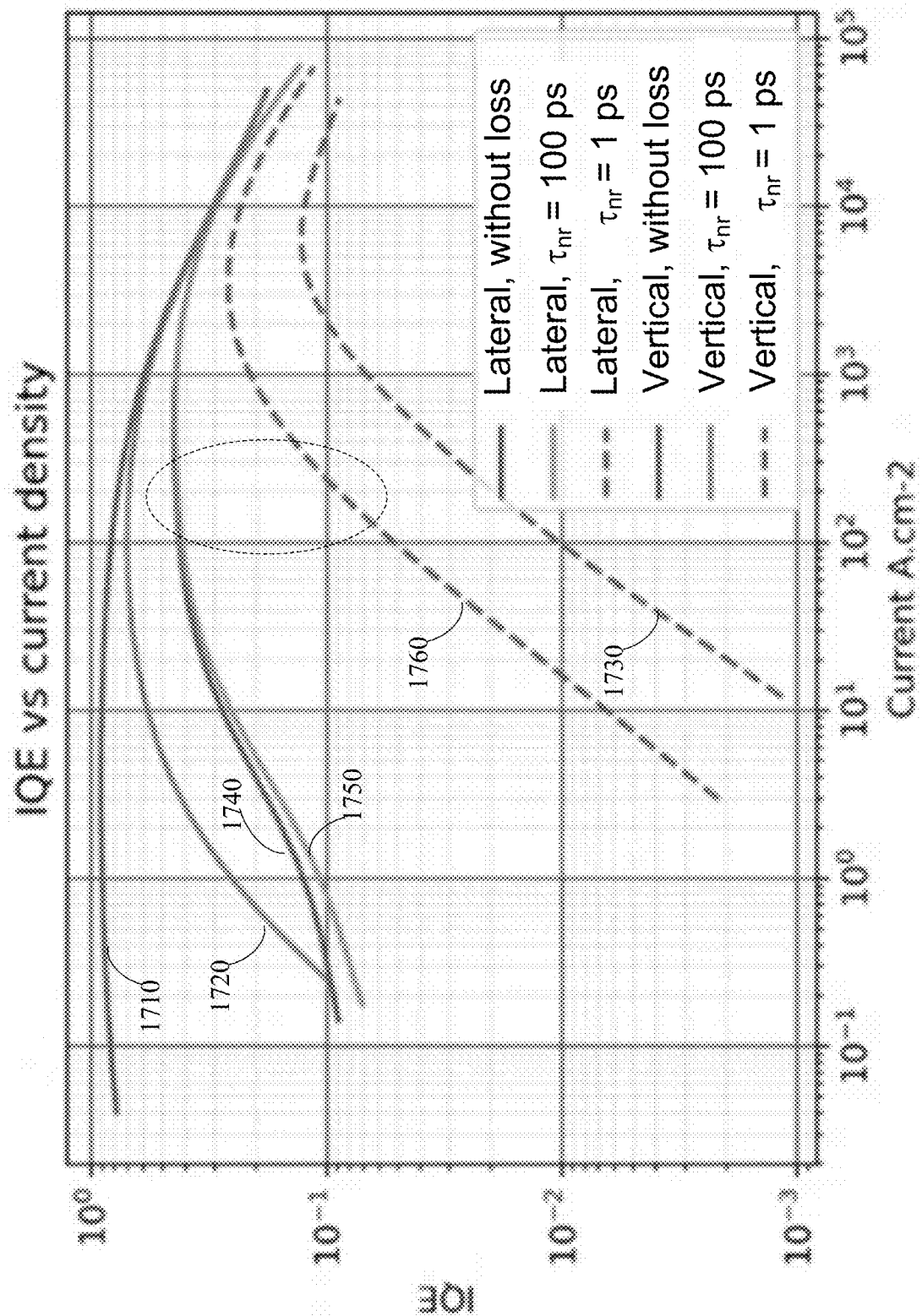
FIG. 17 illustrates simulated internal quantum efficiencies of an example of a lateral micro-LED and an example of a vertical micro-LED with and without surface losses as a function of the current density according to certain embodiments.

FIG. 17 illustrates simulated internal quantum efficiencies of an example of a lateral micro-LED and an example of a vertical micro-LED with and without surface losses as a function of the current density according to certain embodiments. A curve 1710 shows the IQE of a vertical micro-LED (e.g., described above with respect to FIGS. 10A and 11A) without surface loss, as a function of the current density. A curve 1720 shows the IQE of the vertical micro-LED with a non-radiative lifetime $\tau_{nr}$ about 100 ps, as a function of the current density. A curve 1730 shows the IQE of the vertical micro-LED with a non-radiative lifetime $\tau_{nr}$ about 1 ps, as a function of the current density. Curves 1710, 1720, and 1730 show that, in small vertical micro-LEDs, the internal quantum efficiency may drop significantly when the surface loss increases (e.g., non-radiative lifetime decreases).

A curve 1740 in FIG. 17 shows the IQE of a lateral micro-LED disclosed herein (e.g., as described above with respect to FIGS. 11B and 12A) without surface loss, as a function of the current density. A curve 1750 shows the IQE of the lateral micro-LED with a non-radiative lifetime $\tau_{nr}$ about 100 ps, as a function of the current density. A curve 1760 shows the IQE of the lateral micro-LED with a non-radiative lifetime $\tau_{nr}$ about 1 ps, as a function of the current density. Curves 1740, 1750, and 1760 show that, compared with small vertical micro-LEDs, the internal quantum efficiencies of small lateral micro-LEDs may be less sensitive to surface loss.

Figure 18:
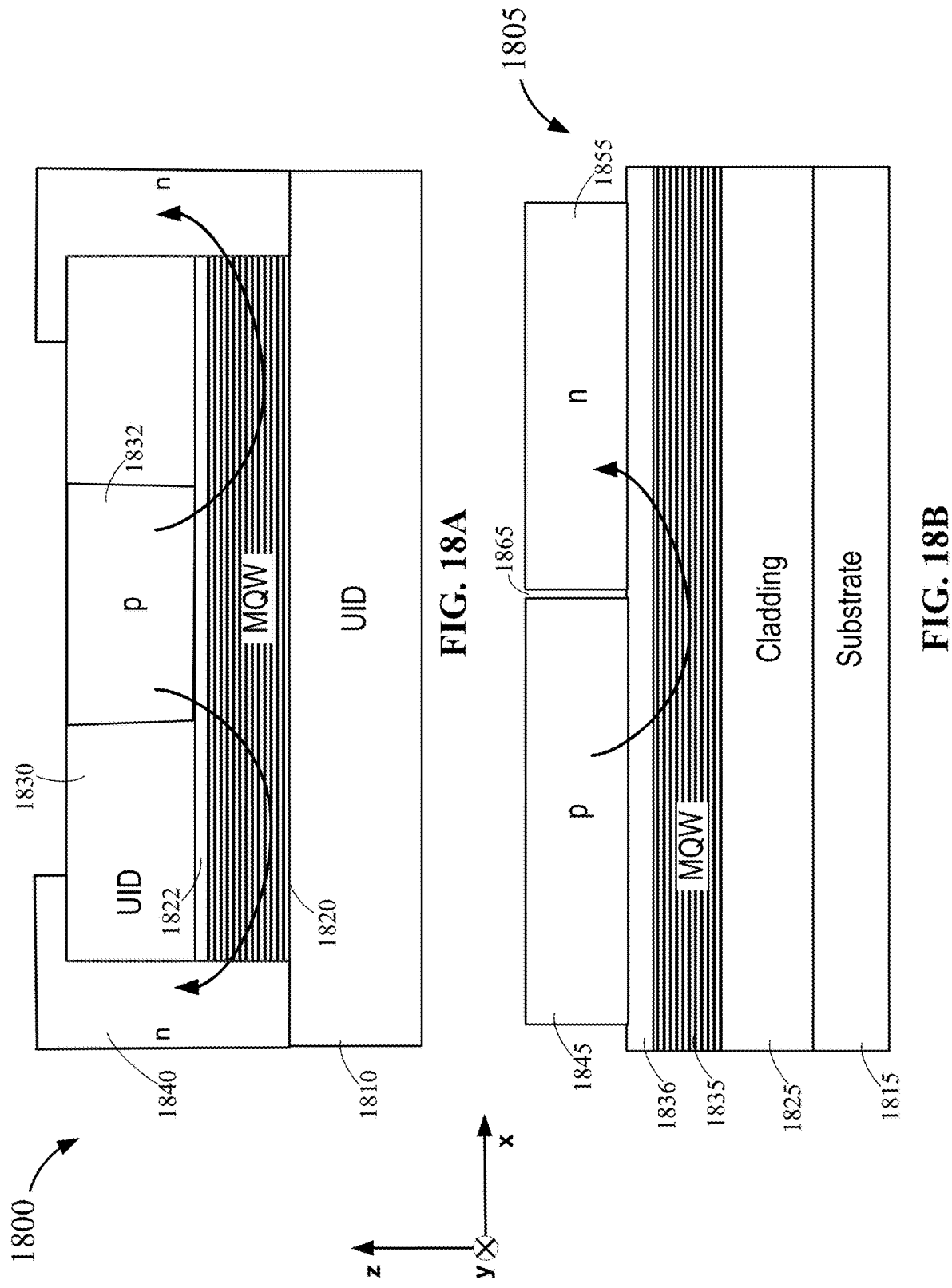
FIG. 18A illustrates another example of a lateral micro-LED according to certain embodiments.
FIG. 18B illustrates yet another example of a lateral micro-LED according to certain embodiments.

FIG. 18A illustrates another example of a lateral micro-LED 1800 according to certain embodiments. Lateral micro-LED 1800 shown in FIG. 18A may include a cladding layer 1810 (e.g., GaN or AlGaInP) that may or may not be doped, an active region 1820 that includes multiple pairs (e.g., more than 10 pairs, 10 pairs, or fewer than 10 pairs) of a quantum well layer and a barrier layer (e.g., a barrier layer 1822). An undoped semiconductor layer 1830 (e.g., undoped AlGaInP) may be formed on active region 1820.

A center region 1832 of undoped semiconductor layer 1830 may be p-doped with, for example, Be, Mg, Zn, Cd, or the like. The dopant atoms (e.g., zinc atoms) may diffuse through a diffusion mask layer at an elevated temperature. The Zn diffusion may form a p-type semiconductor region and/or a p-type ohmic contact. A metal layer may be formed on edges and/or sidewalls of undoped semiconductor layer 1830. An annealing process may then be performed. At a high annealing temperature, the deposited metal layer may alloy with the semiconductor material of undoped semiconductor layer 1830 to form an n-type semiconductor region 1840. The high-temperature anneal may also reduce the unintentional barrier at the interface. In some embodiments, to improve the n-contact and form a ohmic n-contact, dopants such as germanium may be added to the metal layer. In some embodiments, n-electrodes and p-electrodes may be formed on the n-contacts and the p-contacts, respectively. In some embodiments, the metal layer may be deposited on the sidewalls of active region 1820 as well and an n-type semiconductor region may be formed at the sidewall regions of active region 1820.

As illustrated, when a forward bias is applied to lateral micro-LED 1800, a current may flow from the p-type region to the active region, and flow approximately laterally within the quantum well layers to the n-type region. Carriers injected into the quantum well layers from the p-type region and the n-type region may recombine in the quantum well layers (e.g., under the unintentionally doped region or the p-type semiconductor region) to emit light.

FIG. 18B illustrates yet another example of a lateral micro-LED 1805 according to certain embodiments. Lateral micro-LED 1800 may include a substrate 1815 (e.g., GaAs), a cladding layer 1825 (e.g., AlGaInP), and an active region 1835 that includes multiple pairs (e.g., more than 10 pairs, 10 pairs, or fewer than 10 pairs) of a quantum well layer and a barrier layer (e.g., a barrier layer 1836, such as an AlGaInP layer). A p-type semiconductor region 1845 (e.g., p-doped AlGaInP) and an n-type semiconductor region 1855 (e.g., n-doped AlGaInP) may be formed on the active region as described above. An n-electrode and a p-electrode may be formed on n-type semiconductor region 1855 and p-type semiconductor region 1845, respectively. P-type semiconductor region 1845 and n-type semiconductor region 1855 may be separated by an isolation region 1865 that may have a width less than about 100 nm, about 100 nm, or a greater than about 100 nm.

As described above, lateral micro-LED 1805 may be fabricated by performing two growth processes, where the first epitaxial growth process may be used to grow a first doped layer (e.g., p-type semiconductor layer) on the active region. Portions (e.g., right region) of the first doped layer may be removed (e.g., by dry or wet etching), and then a second growth process may be performed to grow a second doped layer (e.g., n-type semiconductor layer) in the region (e.g., the right region) where the first doped layer has been removed.

As illustrated, when a forward bias is applied to lateral micro-LED 1805 through the p-electrode and the n-electrode, a current may flow from the p-type region to the active region, and flow approximately horizontally within the quantum well layers towards the n-type region. Carriers injected into the quantum well layers from the p-type region and the n-type region may recombine in the quantum well layers to emit light before the carriers may reach the sidewall regions of active region 1835.

Figure 19:
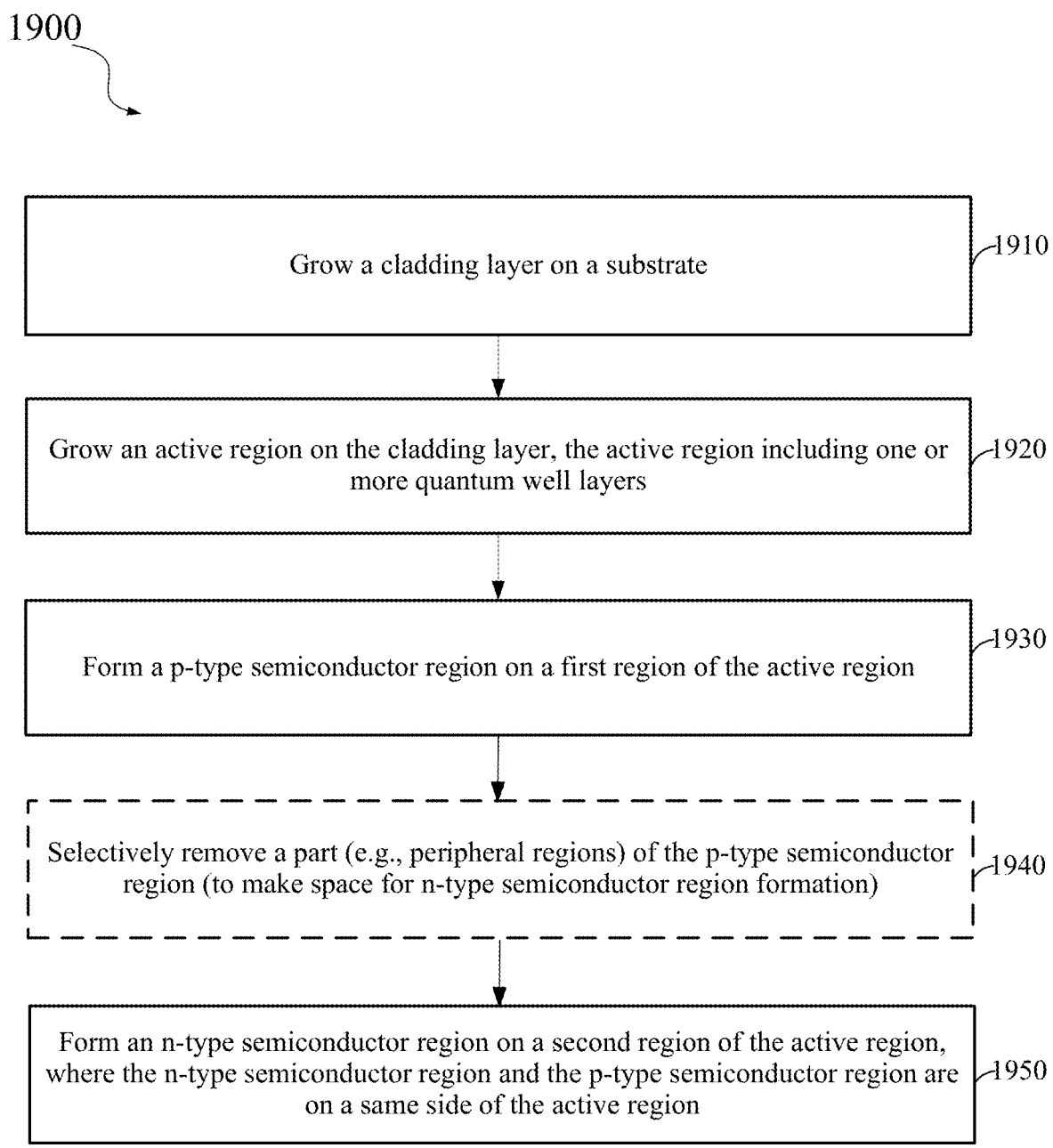
FIG. 19 illustrates an example of a process of fabricating a lateral micro-LED according to certain embodiments.

FIG. 19 includes a flowchart 1900 illustrating an example of a process for fabricating a lateral micro-LED according to certain embodiments. The operations described in flowchart 1900 are for illustration purposes only and are not intended to be limiting. Other sequences of operations can also be performed according to alternative embodiments. For example, alternative embodiments may perform the operations (e.g., operations in blocks 1930-1950) in a different order. Moreover, the individual operations illustrated in FIG. 19 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations at block 1910 may include growing a cladding layer on a substrate. As discussed above, the substrate may include, for example, silicon, GaAs, sapphire, or the like. The cladding layer may be epitaxially grown on the substrate. In some embodiments, a buffer layer may be formed on the substrate and the cladding layer may be grown on the buffer layer. The cladding layer may include, for example, GaN or AlGaInP. The cladding layer may be undoped or unintentionally doped with a p-dopant (e.g., with a doping density about $1 \times 10^{16}$ cm$^{-3}$). The cladding layer may have a thickness between about a few hundred nanometers to over about 1 µm.

Operations at block 1920 may include growing an active region on the cladding layer. The active region may include one or more quantum well layers. In one example, the active region may include pairs of an undoped or unintentionally doped InGaN quantum well layer and an undoped or unintentionally doped GaN barrier layer. In another example, the active region may include pairs of an undoped or unintentionally doped InGaP quantum well layer and an undoped or unintentionally doped AlGaInP barrier layer. Each quantum well layer may have a thickness less than about 10 nm, such as about 2 to about 10 nm. Each barrier layer may have a thickness between a few nanometers (e.g., about 10 nm) to tens of nanometers (e.g., 20 nm or thicker). In some embodiments, the active region may include between one and about ten quantum well layers. In some embodiments, the top most barrier layer may have a thickness higher than other barrier layers in the active region.

Operations at block 1930 may include forming a p-type semiconductor region on a first (e.g., center) region of the active region. In some embodiments, a part (e.g., peripheral regions) of the p-type semiconductor region may be selectively removed at block 1940, for example, by dry or wet etching, to leave space for n-type region formation. Operations at block 1950 may include forming an n-type semiconductor region on a second lateral region of the active region, where the n-type semiconductor region and the p-type semiconductor region may be in different lateral regions on a same side of the active region. In some embodiments, the p-type semiconductor region may be on a center region of the active region for each micro-LED, and the n-type semiconductor region may be on a peripheral region of the active region for each micro-LED and may surround the p-type semiconductor region. In some embodiments, mesa structures for individual micro-LEDs may be etched before or after forming the p-type semiconductor region and the n-type semiconductor region, or after forming a first (p-type or n-type) semiconductor region but before forming a second (n-type or p-type) semiconductor region.

In some embodiments, forming the p-type semiconductor region on the first lateral region of the active region may include growing a p-type semiconductor layer on the active region at block 1930, and selectively etching the p-type semiconductor layer at block 1940 to remove the p-type semiconductor layer on the second lateral region of the active region. Forming the n-type semiconductor region on the second lateral region of the active region at block 1950 may include epitaxially growing an n-type semiconductor layer on the second lateral region of the active region. The n-type semiconductor region and the p-type semiconductor region may be isolated by an isolation region (e.g., a dielectric layer, such as an oxide) that may have a width between about tens of nanometers and about a few hundred nanometers.

In some embodiments, forming the p-type semiconductor region and the n-type semiconductor region may include growing an n-type semiconductor layer on the active region, selectively doping the n-type semiconductor layer on the first lateral region of the active region with a p-type dopant to form the p-type semiconductor region, and etching, before or after the doping, the n-type semiconductor layer to separate the p-type semiconductor region and the n-type semiconductor region. Selectively doping the n-type semiconductor layer on the first lateral region of the active region with the p-type dopant to form the p-type semiconductor region may include diffusion of Zn, Cd, Be, Mg, or the like into the n-type semiconductor layer on the first lateral region of the active region using a diffusion mask. The n-type semiconductor region and the p-type semiconductor region may be isolated by an isolation region (e.g., a dielectric layer, such as an oxide) that may have a width between about tens of nanometers and about a few hundred nanometers.

In some embodiments, forming the p-type semiconductor region and the n-type semiconductor region may include growing an unintentionally doped semiconductor layer on the active region, selectively doping the unintentionally doped semiconductor layer on the first lateral region of the active region with a p-type dopant to form the p-type semiconductor region, depositing a metal layer at a peripheral region of the unintentionally doped semiconductor layer, and annealing the metal layer to alloy the metal layer with the peripheral region of the unintentionally doped semiconductor region to form the n-type semiconductor region and/or an n-type ohmic contact. Selectively doping the unintentionally doped semiconductor layer on the first lateral region of the active region with the p-type dopant may include diffusion of Zn, Cd, Be, Mg, or the like into the n-type semiconductor layer on the first lateral region of the active region using a diffusion mask. The n-type semiconductor region and the p-type semiconductor region may be separated by an unintentionally doped semiconductor region. In some embodiments, the metal layer may also be formed on the sidewalls of the active region and may alloy with the semiconductor material of the active region to form an n-type semiconductor region and/or an n-type ohmic contact with the active region.

FIG. 20A illustrates an example of a method of die-to-wafer bonding for arrays of LEDs according to certain embodiments. In the example shown in FIG. 20A, an LED array 2001 may include a plurality of LEDs 2007 on a carrier substrate 2005. Carrier substrate 2005 may include various materials, such as GaAs, InP, GaN, MN, sapphire, SiC, Si, or the like. LEDs 2007 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 2003 may include a base layer 2009 having passive or active integrated circuits (e.g., driver circuits 2011) fabricated thereon. Base layer 2009 may include, for example, a silicon wafer. Driver circuits 2011 may be used to control the operations of LEDs 2007. For example, the driver circuit for each LED 2007 may include a 2T1C pixel structure that has two transistors and one capacitor. Wafer 2003 may also include a bonding layer 2013. Bonding layer 2013 may include various materials, such as a metal, an oxide, a dielectric, CuSn, AuTi, and the like. In some embodiments, a patterned layer 2015 may be formed on a surface of bonding layer 2013, where patterned layer 2015 may include a metallic grid made of a conductive material, such as Cu, Ag, Au, Al, or the like.

LED array 2001 may be bonded to wafer 2003 via bonding layer 2013 or patterned layer 2015. For example, patterned layer 2015 may include metal pads or bumps made of various materials, such as CuSn, AuSn, or nanoporous Au, that may be used to align LEDs 2007 of LED array 2001 with corresponding driver circuits 2011 on wafer 2003. In one example, LED array 2001 may be brought toward wafer 2003 until LEDs 2007 come into contact with respective metal pads or bumps corresponding to driver circuits 2011. Some or all of LEDs 2007 may be aligned with driver circuits 2011, and may then be bonded to wafer 2003 via patterned layer 2015 by various bonding techniques, such as metal-to-metal bonding. After LEDs 2007 have been bonded to wafer 2003, carrier substrate 2005 may be removed from LEDs 2007.

FIG. 20B illustrates an example of a method of wafer-to-wafer bonding for arrays of LEDs according to certain embodiments. As shown in FIG. 20B, a first wafer 2002 may include a substrate 2004, a first semiconductor layer 2006, active layers 2008, and a second semiconductor layer 2010. Substrate 2004 may include various materials, such as GaAs, InP, GaN, MN, sapphire, SiC, Si, or the like. First semiconductor layer 2006, active layers 2008, and second semiconductor layer 2010 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 2006 may be an n-type layer, and second semiconductor layer 2010 may be a p-type layer. For example, first semiconductor layer 2006 may be an n-doped GaN layer (e.g., doped with Si or Ge), and second semiconductor layer 2010 may be a p-doped GaN layer (e.g., doped with Mg, Ca, Zn, or Be). Active layers 2008 may include, for example, one or more GaN layers, one or more InGaN layers, one or more AlInGaP layers, and the like, which may form one or more heterostructures, such as one or more quantum wells or MQWs.

In some embodiments, first wafer 2002 may also include a bonding layer. Bonding layer 2012 may include various materials, such as a metal, an oxide, a dielectric, CuSn, AuTi, or the like. In one example, bonding layer 2012 may include p-contacts and/or n-contacts (not shown). In some embodiments, other layers may also be included on first wafer 2002, such as a buffer layer between substrate 2004 and first semiconductor layer 2006. The buffer layer may include various materials, such as polycrystalline GaN or MN. In some embodiments, a contact layer may be between second semiconductor layer 2010 and bonding layer 2012. The contact layer may include any suitable material for providing an electrical contact to second semiconductor layer 2010 and/or first semiconductor layer 2006.

First wafer 2002 may be bonded to wafer 2003 that includes driver circuits 2011 and bonding layer 2013 as described above, via bonding layer 2013 and/or bonding layer 2012. Bonding layer 2012 and bonding layer 2013 may be made of the same material or different materials. Bonding layer 2013 and bonding layer 2012 may be substantially flat. First wafer 2002 may be bonded to wafer 2003 by various methods, such as metal-to-metal bonding, eutectic bonding, metal oxide bonding, anodic bonding, thermo-compression bonding, ultraviolet (UV) bonding, and/or fusion bonding.

As shown in FIG. 20B, first wafer 2002 may be bonded to wafer 2003 with the p-side (e.g., second semiconductor layer 2010) of first wafer 2002 facing down (i.e., toward wafer 2003). After bonding, substrate 2004 may be removed from first wafer 2002, and first wafer 2002 may then be processed from the n-side. The processing may include, for example, the formation of certain mesa shapes for individual LEDs, as well as the formation of optical components corresponding to the individual LEDs.

Figure 21B:
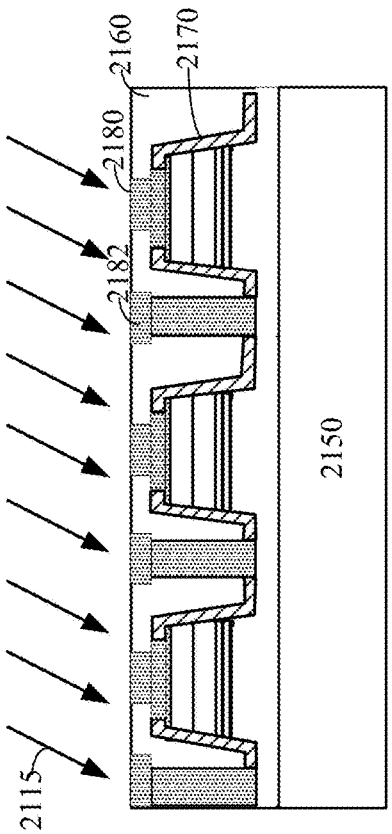
FIGS. 21A-21D illustrates an example of a method of hybrid bonding for arrays of LEDs according to certain embodiments.
Figure 21A:
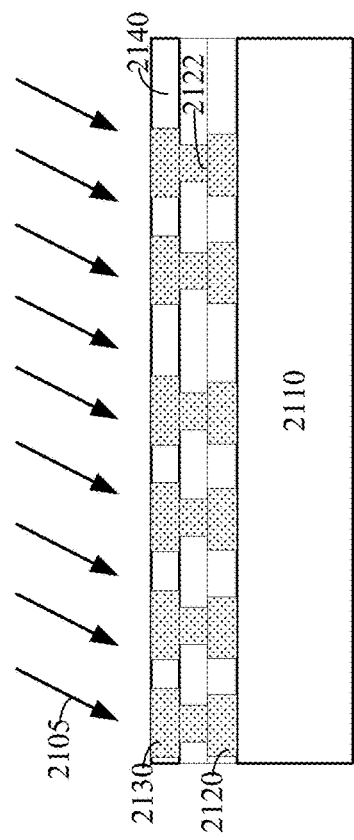

FIGS. 21A-21D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 21A shows a substrate 2110 with passive or active circuits 2120 manufactured thereon. As described above with respect to FIGS. 20A-20B, substrate 2110 may include, for example, a silicon wafer. Circuits 2120 may include driver circuits for the arrays of LEDs. A bonding layer may include dielectric regions 2140 and contact pads 2130 connected to circuits 2120 through electrical interconnects 2122. Contact pads 2130 may include, for example, Cu, Ag, Au, Al, W, Mo, Ni, Ti, Pt, Pd, or the like. Dielectric materials in dielectric regions 2140 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 2105. The activated surface may be atomically clean and may be reactive for formation of direct bonds between wafers when they are brought into contact, for example, at room temperature.

FIG. 21B illustrates a wafer 2150 including an array of micro-LEDs 2170 fabricated thereon as described above. Wafer 2150 may be a carrier wafer and may include, for example, GaAs, InP, GaN, AlN, sapphire, SiC, Si, or the like. Micro-LEDs 2170 may include an n-type layer, an active region, and a p-type layer epitaxially grown on wafer 2150. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 2180 and n-contacts 2182 may be formed in a dielectric material layer 2160 deposited on the mesa structures and may make electrical contacts with the p-type layer and the n-type layers, respectively. Dielectric materials in dielectric material layer 2160 may include, for example, SiCN, $SiO_2$, SiN, $Al_2O_3$, $HfO_2$, $ZrO_2$, $Ta_2O_5$, or the like. P-contacts 2180 and n-contacts 2182 may include, for example, Cu, Ag, Au, Al, W, Mo, Ni, Ti, Pt, Pd, or the like. The top surfaces of p-contacts 2180, n-contacts 2182, and dielectric material layer 2160 may form a bonding layer. The bonding layer may be planarized and polished using, for example, chemical mechanical polishing, where the polishing may cause dishing in p-contacts 2180 and n-contacts 2182. The bonding layer may then be cleaned and activated by, for example, an ion (e.g., plasma)

or fast atom (e.g., Ar) beam 2115. The activated surface may be atomically clean and reactive for formation of direct bonds between wafers when they are brought into contact, for example, at room temperature.

Figure 21D:
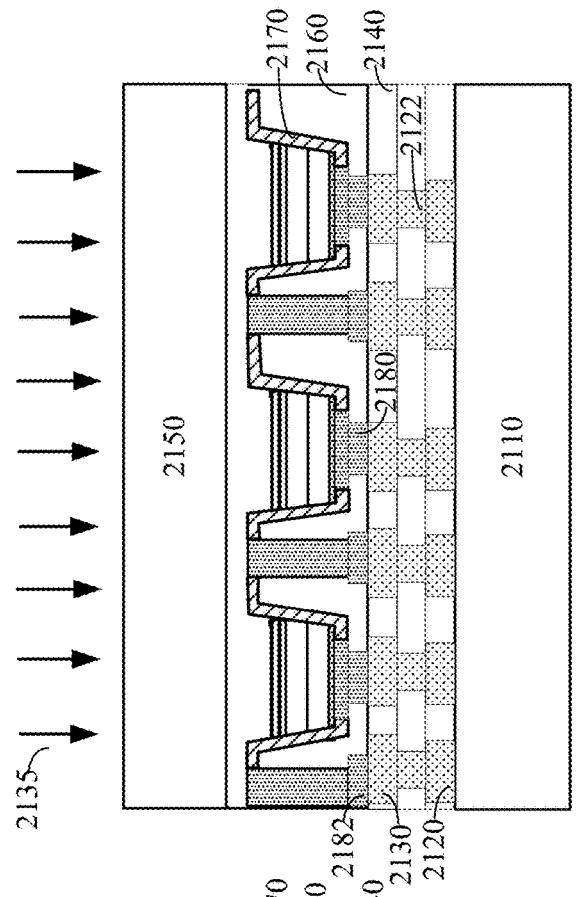
Figure 21C:
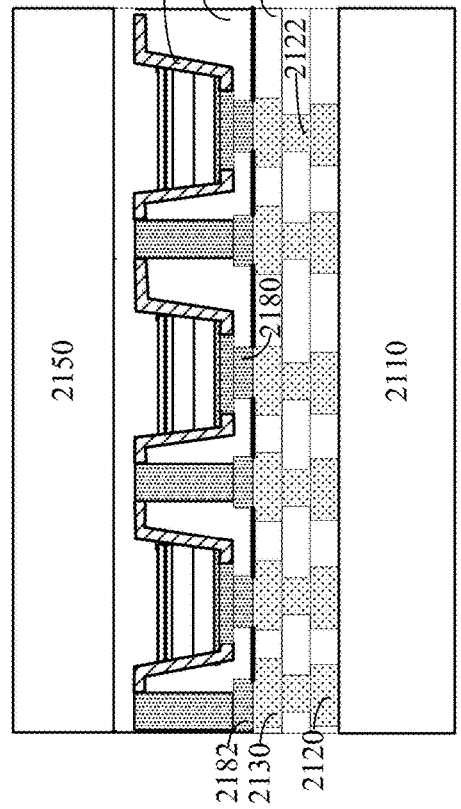

FIG. 21C illustrates a room temperature bonding process for bonding the dielectric materials in the bonding layers. For example, after the bonding layer that includes dielectric regions 2140 and contact pads 2130 and the bonding layer that includes p-contacts 2180, n-contacts 2182, and dielectric material layer 2160 are surface activated, wafer 2150 and micro-LEDs 2170 may be turned upside down and brought into contact with substrate 2110 and the circuits formed thereon. In some embodiments, compression pressure 2125 may be applied to substrate 2110 and wafer 2150 such that the bonding layers are pressed against each other. Due to the surface activation and the dishing in the contacts, dielectric regions 2140 and dielectric material layer 2160 may be in direct contact because of the surface attractive force, and may react and form chemical bonds between them because the surface atoms may have dangling bonds and may be in unstable energy states after the activation. Thus, the dielectric materials in dielectric regions 2140 and dielectric material layer 2160 may be bonded together with or without heat treatment or pressure.

FIG. 21D illustrates an annealing process for bonding the contacts in the bonding layers after bonding the dielectric materials in the bonding layers. For example, contact pads 2130 and p-contacts 2180 or n-contacts 2182 may be bonded together by annealing at, for example, about 210-400° C. or higher. During the annealing process, heat 2135 may cause the contacts to expand more than the dielectric materials (due to different coefficients of thermal expansion), and thus may close the dishing gaps between the contacts such that contact pads 2130 and p-contacts 2180 or n-contacts 2182 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 22:
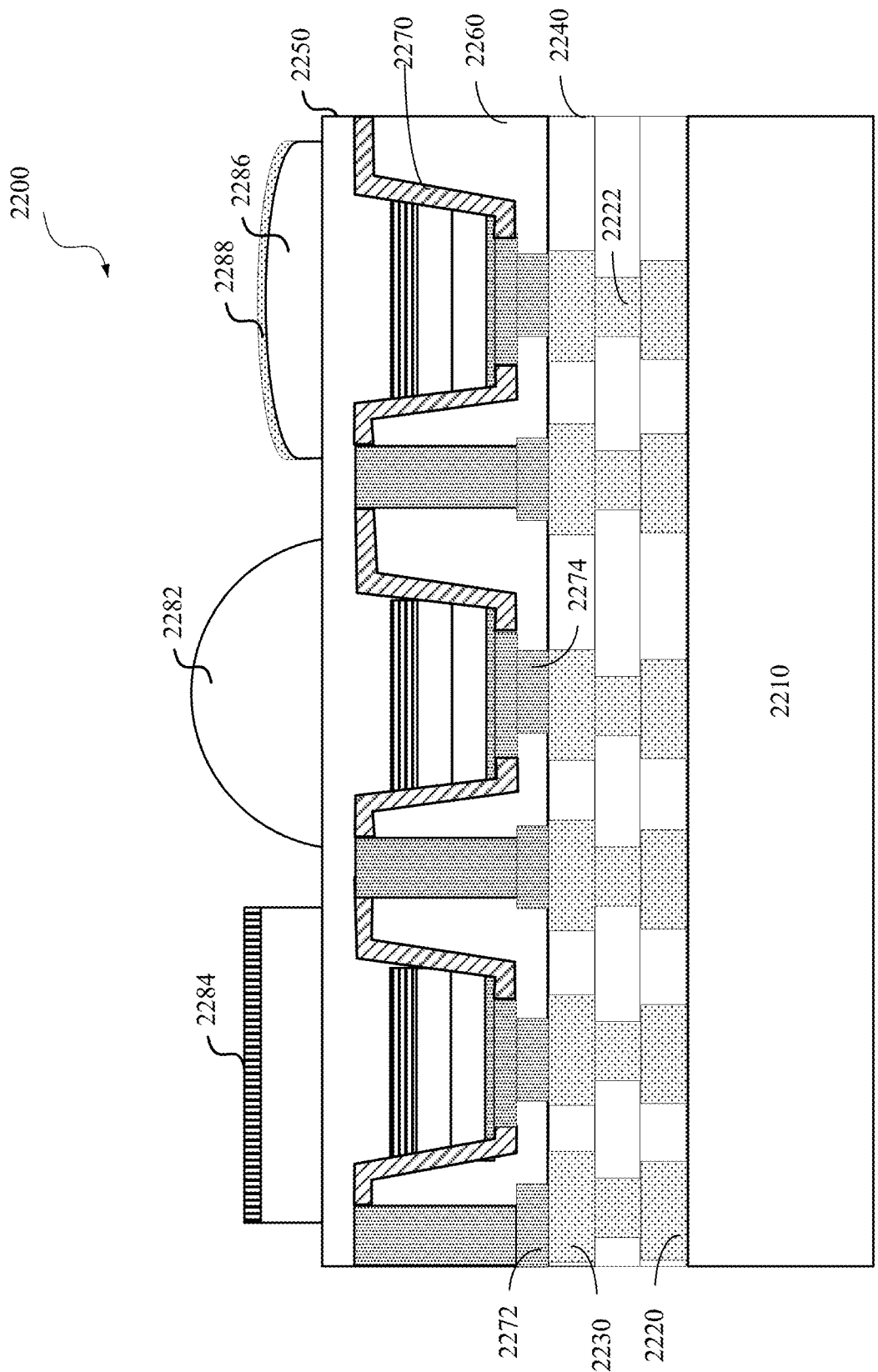
FIG. 22 illustrates an example of an LED array with secondary optical components fabricated thereon according to certain embodiments.

FIG. 22 illustrates an example of an LED array 2200 with secondary optical components fabricated thereon according to certain embodiments. LED array 2200 may be made by bonding an LED chip or wafer with a silicon wafer including electrical circuits fabricated thereon, using any suitable bonding techniques described above with respect to, for example, FIGS. 20A-21D. In the example shown in FIG. 22, LED array 2200 may be bonded using a wafer-to-wafer hybrid bonding technique as described above with respect to FIG. 21A-21D. LED array 2200 may include a substrate 2210, which may be, for example, a silicon wafer. Integrated circuits 2220, such as LED driver circuits, may be fabricated on substrate 2210. Integrated circuits 2220 may be connected to p-contacts 2274 and n-contacts 2272 of micro-LEDs 2270 through interconnects 2222 and contact pads 2230, where contact pads 2230 may form metallic bonds with p-contacts 2274 and n-contacts 2272. Dielectric layer 2240 on substrate 2210 may be bonded to dielectric layer 2260 through fusion bonding.

The substrate (not shown) of the LED chip or wafer may be thinned or may be removed to expose the n-type layer 2250 of micro-LEDs 2270. Various secondary optical components, such as a spherical micro-lens 2282, a grating 2284, a micro-lens 2286, an antireflection layer 2288, and the like, may be formed in or on top of n-type layer 2250. For example, spherical micro-lens arrays may be etched in the semiconductor materials of micro-LEDs 2270 using a gray-scale mask and a photoresist with a linear response to exposure light, or using an etch mask formed by thermal reflowing of a patterned photoresist layer. The secondary optical components may also be etched in a dielectric layer deposited on n-type layer 2250 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 2270 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 22 to show some examples of secondary optical components that can be formed on micro-LEDs 2270, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 23:
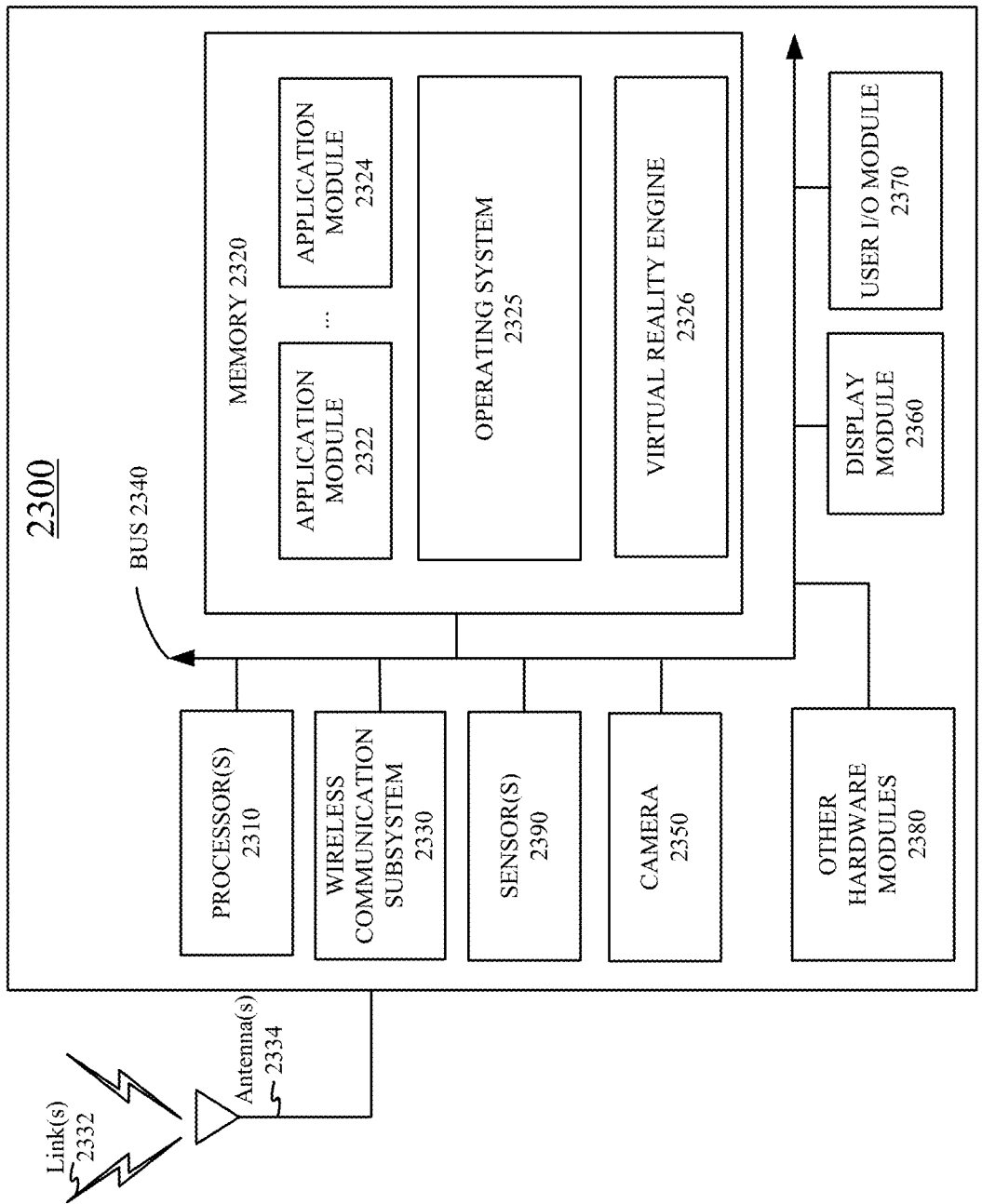
FIG. 23 is a simplified block diagram of an electronic system of an example of a near-eye display according to certain embodiments.

FIG. 23 is a simplified block diagram of an example electronic system 2300 of an example near-eye display (e.g., HMD device) for implementing some of the examples disclosed herein. Electronic system 2300 may be used as the electronic system of an HMD device or other near-eye displays described above. In this example, electronic system 2300 may include one or more processor(s) 2310 and a memory 2320. Processor(s) 2310 may be configured to execute instructions for performing operations at a number of components, and can be, for example, a general-purpose processor or microprocessor suitable for implementation within a portable electronic device. Processor(s) 2310 may be communicatively coupled with a plurality of components within electronic system 2300. To realize this communicative coupling, processor(s) 2310 may communicate with the other illustrated components across a bus 2340. Bus 2340 may be any subsystem adapted to transfer data within electronic system 2300. Bus 2340 may include a plurality of computer buses and additional circuitry to transfer data.

Memory 2320 may be coupled to processor(s) 2310. In some embodiments, memory 2320 may offer both short-term and long-term storage and may be divided into several units. Memory 2320 may be volatile, such as static random access memory (SRAM) and/or dynamic random access memory (DRAM) and/or non-volatile, such as read-only memory (ROM), flash memory, and the like. Furthermore, memory 2320 may include removable storage devices, such as secure digital (SD) cards. Memory 2320 may provide storage of computer-readable instructions, data structures, program modules, and other data for electronic system 2300. In some embodiments, memory 2320 may be distributed into different hardware modules. A set of instructions and/or code might be stored on memory 2320. The instructions might take the form of executable code that may be executable by electronic system 2300, and/or might take the form of source and/or installable code, which, upon compilation and/or installation on electronic system 2300 (e.g., using any of a variety of generally available compilers, installation programs, compression/decompression utilities, etc.), may take the form of executable code.

In some embodiments, memory 2320 may store a plurality of application modules 2322 through 2324, which may include any number of applications. Examples of applications may include gaming applications, conferencing applications, video playback applications, or other suitable applications. The applications may include a depth sensing function or eye tracking function. Application modules 2322-2324 may include particular instructions to be executed by processor(s) 2310. In some embodiments, certain applications or parts of application modules 2322-2324 may be executable by other hardware modules 2380. In certain embodiments, memory 2320 may additionally include secure memory, which may include additional security controls to prevent copying or other unauthorized access to secure information.

In some embodiments, memory 2320 may include an operating system 2325 loaded therein. Operating system 2325 may be operable to initiate the execution of the instructions provided by application modules 2322-2324 and/or manage other hardware modules 2380 as well as interfaces with a wireless communication subsystem 2330 which may include one or more wireless transceivers. Operating system 2325 may be adapted to perform other operations across the components of electronic system 2300 including threading, resource management, data storage control and other similar functionality.

Wireless communication subsystem 2330 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2300 may include one or more antennas 2334 for wireless communication as part of wireless communication subsystem 2330 or as a separate component coupled to any portion of the system. Depending on desired functionality, wireless communication subsystem 2330 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2330 may permit data to be exchanged with a network, other computer systems, and/or any other devices described herein. Wireless communication subsystem 2330 may include a means for transmitting or receiving data, such as identifiers of HMD devices, position data, a geographic map, a heat map, photos, or videos, using antenna(s) 2334 and wireless link(s) 2332. Wireless communication subsystem 2330, processor(s) 2310, and memory 2320 may together comprise at least a part of one or more of a means for performing some functions disclosed herein.

Embodiments of electronic system 2300 may also include one or more sensors 2390. Sensor(s) 2390 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2390 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2300 may include a display module 2360. Display module 2360 may be a near-eye display, and may graphically present information, such as images, videos, and various instructions, from electronic system 2300 to a user. Such information may be derived from one or more application modules 2322-2324, virtual reality engine 2326, one or more other hardware modules 2380, a combination thereof, or any other suitable means for resolving graphical content for the user (e.g., by operating system 2325). Display module 2360 may use LCD technology, LED technology (including, for example, OLED, ILED, μ-LED, AMO-LED, TOLED, etc.), light emitting polymer display (LPD) technology, or some other display technology.

Electronic system 2300 may include a user input/output module 2370. User input/output module 2370 may allow a user to send action requests to electronic system 2300. An action request may be a request to perform a particular action. For example, an action request may be to start or end an application or to perform a particular action within the application. User input/output module 2370 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2300. In some embodiments, user input/output module 2370 may provide haptic feedback to the user in accordance with instructions received from electronic system 2300. For example, the haptic feedback may be provided when an action request is received or has been performed.

Electronic system 2300 may include a camera 2350 that may be used to take photos or videos of a user, for example, for tracking the user's eye position. Camera 2350 may also be used to take photos or videos of the environment, for example, for VR, AR, or MR applications. Camera 2350 may include, for example, a complementary metal-oxide-semiconductor (CMOS) image sensor with a few millions or tens of millions of pixels. In some implementations, camera 2350 may include two or more cameras that may be used to capture 3-D images.

In some embodiments, electronic system 2300 may include a plurality of other hardware modules 2380. Each of other hardware modules 2380 may be a physical module within electronic system 2300. While each of other hardware modules 2380 may be permanently configured as a structure, some of other hardware modules 2380 may be temporarily configured to perform specific functions or temporarily activated. Examples of other hardware modules 2380 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2380 may be implemented in software.

In some embodiments, memory 2320 of electronic system 2300 may also store a virtual reality engine 2326. Virtual reality engine 2326 may execute applications within electronic system 2300 and receive position information, acceleration information, velocity information, predicted future positions, or any combination thereof of the HMD device from the various sensors. In some embodiments, the information received by virtual reality engine 2326 may be used for producing a signal (e.g., display instructions) to display module 2360. For example, if the received information indicates that the user has looked to the left, virtual reality engine 2326 may generate content for the HMD device that mirrors the user's movement in a virtual environment. Additionally, virtual reality engine 2326 may perform an action within an application in response to an action request received from user input/output module 2370 and provide feedback to the user. The provided feedback may be visual, audible, or haptic feedback. In some implementations, processor(s) 2310 may include one or more GPUs that may execute virtual reality engine 2326.

In various implementations, the above-described hardware and modules may be implemented on a single device or on multiple devices that can communicate with one another using wired or wireless connections. For example, in some implementations, some components or modules, such as GPUs, virtual reality engine 2326, and applications (e.g., tracking application), may be implemented on a console separate from the head-mounted display device. In some implementations, one console may be connected to or support more than one HMD.

In alternative configurations, different and/or additional components may be included in electronic system 2300. Similarly, functionality of one or more of the components can be distributed among the components in a manner different from the manner described above. For example, in some embodiments, electronic system 2300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A lateral micro-light emitting diode (micro-LED) comprising:
    a first semiconductor layer;
    an active region on the first semiconductor layer, the active region including one or more quantum well layers configured to emit light;
    a p-type semiconductor region on a first lateral region of the active region;
    an n-type semiconductor region on a second lateral region of the active region, wherein the n-type semiconductor region and the p-type semiconductor region are on a same side of the active region, and wherein the p-type semiconductor region is surrounded by the n-type semiconductor region; and
    an isolation region between the p-type semiconductor region and the n-type semiconductor region, the isolation region including a dielectric region, an air gap, or an undoped semiconductor region.

2. The lateral micro-LED of claim 1, wherein a lateral size of the active region is less than 10 μm.

3. The lateral micro-LED of claim 1, wherein the isolation region is characterized by a width less than 250 nm.

4. The lateral micro-LED of claim 1, wherein the one or more quantum well layers are configured to emit red light.

5. The lateral micro-LED of claim 4, wherein the one or more quantum well layers include InGaP layers, each of the InGaP layers characterized by a thickness less than 10 nm.

6. The lateral micro-LED of claim 1, wherein the first semiconductor layer includes a cladding layer that is undoped or lightly p-doped.

7. The lateral micro-LED of claim 1, wherein the one or more quantum well layers include 4 or more quantum well layers.

8. The lateral micro-LED of claim 1, wherein:
the active region includes a top barrier layer characterized by a thickness higher than other barrier layers in the active region;
the top barrier layer is adjacent to the p-type semiconductor region and the n-type semiconductor region; and
the top barrier layer is undoped or unintentional doped.

9. A lateral micro-light emitting diode (micro-LED) comprising:
a substrate;
a cladding layer on the substrate;
an active region on the cladding layer, the active region including one or more quantum well layers configured to emit light;
a p-type semiconductor region on a first lateral region of the active region;
an undoped or unintentionally doped semiconductor region on a second lateral region of the active region and adjacent the p-type semiconductor region; and
an n-contact region formed in a peripheral region of the undoped or unintentionally doped semiconductor region, a peripheral region of the active region, or both.

10. The lateral micro-LED of claim 9, wherein a lateral size of the lateral micro-LED is less than 10 μm.

11. The lateral micro-LED of claim 9, wherein the p-type semiconductor region is on a center region of the active region and is surrounded by the undoped or unintentionally doped semiconductor region.

12. The lateral micro-LED of claim 9, wherein the one or more quantum well layers include InGaP layers, each of the InGaP layers characterized by a thickness less than 10 nm.

13. The lateral micro-LED of claim 9, wherein:
the p-type semiconductor region and the undoped or unintentionally doped semiconductor region are formed in a same epitaxial layer; and
the p-type semiconductor region includes a p-type dopant diffused in the epitaxial layer.

14. The lateral micro-LED of claim 9, wherein the n-contact region includes a metal layer that alloys with the peripheral region of the undoped or unintentionally doped semiconductor region, the peripheral region of the active region, or both.

* * * * *